(12) United States Patent
Nakayama et al.

(10) Patent No.: US 9,006,711 B2
(45) Date of Patent: Apr. 14, 2015

(54) WHITE ORGANIC ELECTROLUMINESCENT ELEMENT AND LIGHTING DEVICE

(75) Inventors: Yoriko Nakayama, Tokyo (JP); Tomoyuki Nakayama, Tokyo (JP); Kunimasa Hiyama, Tokyo (JP); Shigeru Kojima, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 922 days.

(21) Appl. No.: 12/595,921

(22) PCT Filed: Apr. 4, 2008

(86) PCT No.: PCT/JP2008/056777
§ 371 (c)(1),
(2), (4) Date: Oct. 14, 2009

(87) PCT Pub. No.: WO2008/132965
PCT Pub. Date: Nov. 6, 2008

(65) Prior Publication Data
US 2010/0127246 A1    May 27, 2010

(30) Foreign Application Priority Data

Apr. 17, 2007 (JP) ................................. 2007-107989

(51) Int. Cl.
*H01L 29/08* (2006.01)
*H05B 33/14* (2006.01)
(Continued)

(52) U.S. Cl.
CPC ................ *H05B 33/14* (2013.01); *C09K 11/06* (2013.01); *C09K 2211/1029* (2013.01);
(Continued)

(58) Field of Classification Search
CPC ................................................... H01L 51/0073
USPC .......................................................... 257/40
See application file for complete search history.

(56) References Cited

U.S. PATENT DOCUMENTS

| | | | |
|---|---|---|---|
| 6,097,147 | A | 8/2000 | Baldo et al. |
| 7,611,779 | B2 * | 11/2009 | Kanno et al. ................ 428/690 |

(Continued)

FOREIGN PATENT DOCUMENTS

| | | |
|---|---|---|
| JP | 2003229272 | 8/2003 |
| JP | 200463349 | 2/2004 |
| JP | 200538672 | 2/2005 |
| JP | 2005100767 | 4/2005 |
| JP | 2005108572 | 4/2005 |

(Continued)

OTHER PUBLICATIONS

Takizawa, S., et al. "Phosphorescent Iridium Complexes Based on 2-Phenylimidazo[1,2-a]pyridine Ligands: Tuning of Emission Color toward the Blue Region and Application to Polymer Light-Emitting Devices." Inorg. Chem., vol. 46, No. 10 (Apr. 13, 2007): pp. 4308-4319.*

*Primary Examiner* — Mark Tornow
(74) *Attorney, Agent, or Firm* — Lucas & Mercanti, LLP

(57) ABSTRACT

Disclosed is a white light-emitting organic electroluminescent device, which is excellent in stability of emission chromaticity over a long operation period, while having high electrical efficiency, long life, excellent storage stability and excellent color rendering properties. Also disclosed is an illuminating device using such an organic electroluminescent device. Specifically disclosed is an organic electroluminescent device having a light-emitting layer between an anode and a cathode, which is characterized by comprising a light-emitting layer A having a maximum emission wavelength of not more than 480 nm and containing a phosphorescent dopant having a maximum emission wavelength of not more than 480 nm, and a light-emitting layer B arranged between the light-emitting layer A and the anode, which has a maximum emission wavelength of not less than 510 nm and contains a phosphorescent dopant. This organic electroluminescent device is also characterized in that the concentration of the phosphorescent dopant contained in the light-emitting layer A varies in the thickness direction of the light-emitting layer A. Also specifically disclosed is an illuminating device using such a white light-emitting organic electroluminescent device.

6 Claims, 1 Drawing Sheet

(51) Int. Cl.
*C09K 11/06* (2006.01)
*H01L 51/00* (2006.01)
*H01L 51/50* (2006.01)

(52) U.S. Cl.
CPC .......... *C09K 2211/1044* (2013.01); *C09K 2211/1092* (2013.01); *C09K 2211/185* (2013.01); *H01L 51/0071* (2013.01); H01L 51/0072 (2013.01); H01L 51/0085 (2013.01); *H01L 51/0086* (2013.01); H01L 51/0087 (2013.01); *H01L 51/0088* (2013.01); *H01L 51/5016* (2013.01); *H01L 51/5036* (2013.01); *Y02B 20/181* (2013.01)

(56) References Cited

U.S. PATENT DOCUMENTS

2005/0046337 A1* 3/2005 Chin et al. ............ 313/504
2008/0303415 A1* 12/2008 Suzuri et al. .......... 313/504

FOREIGN PATENT DOCUMENTS

| | | | | |
|---|---|---|---|---|
| JP | 2005310742 | 11/2005 | | |
| WO | 2005109543 | 11/2005 | | |
| WO | 2006009024 | 1/2006 | | |
| WO | 2006013738 | 2/2006 | | |
| WO | WO2006/013738 | * | 2/2006 | ........ H01J 1/63 |

* cited by examiner

LIGHT

LIGHT

WHITE ORGANIC ELECTROLUMINESCENT ELEMENT AND LIGHTING DEVICE

CROSS REFERENCE TO RELATED APPLICATION

This is a U.S. National Phase Application under 35 U.S.C. 371 of International Application PCT/JP2008/056777, filed Apr. 4, 2008, which claims the priority of Japanese Application No. 2007-107989, filed Apr. 17, 2007, the entire content of both Applications are hereby incorporated by reference.

TECHNICAL FIELD

The present invention relates to a white light emitting organic electroluminescent element which contains a plurality of light emitting materials having a different emission wavelength and includes a blue phosphorescence emitting material. The present invention also relates to a lighting device using the aforesaid white organic electroluminescent element.

BACKGROUND ART

An emission type electronic display device includes an electroluminescence display (hereinafter, referred to as an ELD). A constituent element of an ELD includes such as an inorganic electroluminescent element ((hereinafter, it is also referred to as an inorganic EL element) and an organic electroluminescent element (hereinafter, it is also referred to as an organic EL element). An inorganic electroluminescent element has been utilized as a flat light source, however, it requires a high voltage of alternating current to operate an emission element.

On the other hand, an organic electroluminescent element is an element provided with a constitution comprising an emitting layer containing a emitting substance being sandwiched with a cathode and an anode, and an exciton is generated by an electron and a positive hole being injected into the emitting layer to be recombined, resulting emission utilizing light release (fluorescence·phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

Further, the major feature of the organic electroluminescent elements is also in the form of a surface light source differing from conventionally employed main light sources such as a light emitting diode or a cold-cathode tube. Possible applications, which can effectively utilize the above characteristic, include light sources for lighting and backlights of various displays. In particular, it is also appropriate to employ them as a backlight of liquid crystal full color displays, of which demand is markedly increasing over recent years.

When the organic electroluminescent elements are employed as the above light source for lighting or the display backlight, they are employed as a light source which has white or so-called electric bulb color (hereinafter together referred to as white). In order to realize white light emission by employing the organic electroluminescent elements, there available are; a method which realizes white by a color mixture by preparing a plurality of light emitting materials differing in their emitted light wavelength in a single element; a method which realizes white in such a manner that light emitting pixels of multi colors, such as three colors of blue, green, and red, are separately coated, the above pixels are allowed to emit light simultaneously, and then the emitted lights are mixed; and a method which realize white employing color conversion dyes (for example, a combination of a blue light emitting material and a color conversion fluorescent dye).

However, when consideration is made based on various demands such as lower cost, higher productivity, or more convenient driving methods, which are demanded for the light source for lighting and the backlight, the method, which realizes white by a color mixture by preparing a plurality of light emitting materials differing in emitted light wavelengths in a single element, is useful for these applications, and in recent years, research and development of the same have been increasingly conducted.

The method which realizes white based on the above method will further be detailed. There are listed: a method which realize white in such a manner that two light emitting materials in a relation of complementary colors to each other, such as a blue light emitting material and a yellow light emitting material, and the colors are mixed, and a method which realizes white in such a manner that light emitting materials of three colors of blue, green, and red, are employed and the colors are mixed.

For example, it is disclosed in Japanese Patent Publication Open to Public Inspection (JP-A) No. 2004-235168 a method for preparing a white organic electroluminescent element by doping with high efficient phosphors of three colors of blue, green and red, as a light emitting material.

In recent years, in contrast to fluorescence materials, there have been actively investigated phosphorescence materials by which an organic electroluminescent element having a high luminance can be achieved (for example, refer to Patent Document 1, Non-patent Documents 1 and 2). Previously reported light emission from a fluorescence material utilizes emission from an excited singlet. Since a generation ratio of a singlet exciton to a triplet exciton is 1:3, that is, a generation probability of an emitting exciton species is 25%. On the other hand, in the case of a phosphorescence material which utilizes an emission from an excited triplet state, the upper limitation of the internal quantum efficiency will be 100% by considering the production ratio of excitons and internal conversion of a singlet exciton to a triplet exciton. The light emission efficiency will be theoretically four times at maximum of the fluorescence emitting material.

However, there has been developed no good phosphorescence emitting material which yields blue emission and has properties of high light emission efficiency, high durability and especially a prolonged driving lifetime. Therefore, it has been difficult to develop an organic electroluminescent element of practical use which employs a blue phosphorescence emitting material.

As a method to improve the lifetime for half decrease of an initial luminance, there is disclosed an example method in which the concentration of a light emitting material in a light emitting layer is changed in the thickness direction of the light emitting layer (for example, refer to Patent Document 2). However, there is no description on light emission efficiency in this document in the document. The method disclosed is not a method enabling compatibility of both lifetime and light emission efficiency.

As a method to improve both emission lifetime and light emission efficiency, there is disclosed an example method in which the same host compound is employed in the entire organic layers; and a positive hole transporting material, an electron transporting material and a light emitting material are doped with having a concentration gradient in the organic layers (for example, refer to Patent Document 3).

This method was developed based on the assumption that an interface produced by lamination of layers containing a various functional materials will lead deterioration of lifetime. When various doping materials are doped to the same host compound located in the entire organic layer, the concentration of the doping materials is controlled to be decreased to zero at an end portion of the doping area. It was expected that the interfaces will disappear by this method, and as a result, the lifetime will be prolonged. The concentrations of a light emitting material are decreased at both end portions in the depth direction of the light emitting layer and there disappear the interfaces with regards to the light emitting layer. However, the concentrations of a dope in the middle portion of the depth direction of the light emitting layer, which is attributed to be engaged in substantial light emission, remains constant. In this method, the laminated layer structure is not changed from the conventional one. Therefore, the chromaticity stability after a prolonged driving time will not be improved. Further, there is no description about the chromaticity stability.

Patent Document 1: U.S. Pat. No. 6,097,147
Patent Document 2: JP-A No. 2003-229272
Patent Document 3: JP-A No. 2005-100767
Non-Patent Document 1: M. A. Baldo et al., Nature, Volume 395, pages 151-154 (1998)
Non-Patent Document 2: M. A. Baldo et al., Nature, Volume 403, No. 17, pages 750-753 (2000)

DISCLOSURE OF THE INVENTION

Problems to be Solved by the Invention

The present invention was made in view of the above-mentioned problems. An object of the present invention is to provide an organic electroluminescent element yielding white luminescence which is excellent in electric power efficiency, storage stability, color rendering properties, as well as emission color stability even after driving for a prolonged time. An object of the present invention is also to provide a lighting device using the aforesaid organic electroluminescent element.

Means to Solved the Problems

An object of the present invention described above can be achieved by the following constitutions.
1. A white organic electroluminescent element comprising light emitting layers between an anode and a cathode,
wherein the light emitting layers include a light emitting layer A which contains a phosphorescence emitting dopant exhibiting a maximum emission wavelength of 480 nm or less; and a light emitting layer B which contains a phosphorescence emitting dopant exhibiting a maximum emission wavelength of 510 nm or more,
provided that the light emitting layer B is located between the light emitting layer A and the anode; and
a concentration of the phosphorescence emitting dopant in the light emitting layer A changes in a thickness direction of the light emitting layer A.
2. The white organic electroluminescent element described in the aforesaid Item 1,
wherein the phosphorescence emitting dopant contained in the light emitting layer A has at least one of partial structures represented by Formulas (A) to (C).

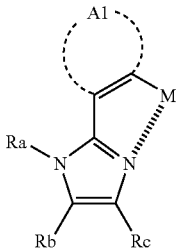

Formula (A)

In the formula, Ra represents a hydrogen atom, an aliphatic group, an aromatic group or a heterocyclic group; Rb and Rc each represent a hydrogen atom or a substituent; A1 represents a group of atoms necessary to form an aromatic ring or an aromatic heterocyclic ring; and M represents Ir or Pt.

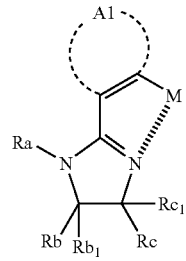

Formula (B)

In the formula, Ra represents a hydrogen atom, an aliphatic group, an aromatic group or a heterocyclic group; Rb, Rc, $Rb_1$ and $Rc_1$ each represent a hydrogen atom or a substituent; A1 represents a group of atoms necessary to form an aromatic ring or an aromatic heterocyclic ring; and M represents Ir or Pt.

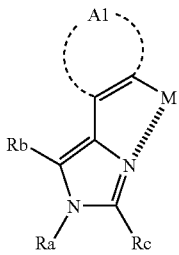

Formula (C)

In the formula, Ra represents a hydrogen atom, an aliphatic group, an aromatic group or a heterocyclic group; Rb and Rc each represent a hydrogen atom or a substituent; A1 represents a group of atoms necessary to form an aromatic ring or an aromatic heterocyclic ring; and M represents Ir or Pt.
3. The white organic electroluminescent element described in the aforesaid Items 1 or 2,
wherein at least one of the phosphorescence emitting dopants contained in the light emitting layer A exhibits a maximum emission wavelength of 465 nm or less.
4. The white organic electroluminescent element described in any one of the aforesaid Items 1 to 3,
wherein the light emitting layer B contains at least two phosphorescence emitting dopants each exhibiting an maximum emission wavelength differing in an amount of 30 nm or more with each other.

5. The white organic electroluminescent element described in any one of the aforesaid Items 1 to 4, wherein the light emitting layer A and the light emitting layer B each contain a host compound having the same structure with each other and having a glass transition temperature of 90° C. or more.

6. The white organic electroluminescent element described in any one of the aforesaid Items 1 to 5, wherein the concentration of at least one of the phosphorescence emitting dopants contained in the light emitting layer A is decreased from a side of the anode to a side of the cathode in a thickness direction of the light emitting layer A.

7. A lighting device comprising the white organic electroluminescent element described in any one of the aforesaid Items 1 to 6.

Effect of the Invention

The present invention has enabled to provide an organic electroluminescent element yielding white luminescence which is excellent in electric power efficiency, storage stability, color rendering properties, as well as emission color stability even after driving for a prolonged time. The present invention has also enabled to provide a lighting device using the aforesaid organic electroluminescent element.

Figure 1:
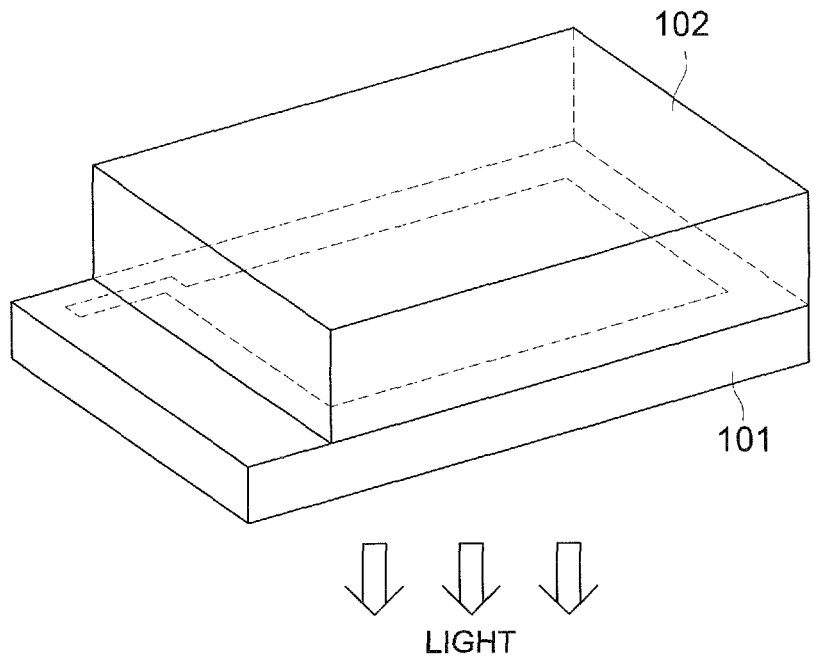
FIG. 1 is a schematic drawing to show an example of a lighting device containing a white organic EL element of the present invention.

DESCRIPTION OF SYMBOLS 101 organic EL element
102 glass cover
105 cathode
106 organic EL layer
107 glass substrate having a transparent electrode
108 nitrogen gas
109 desiccant

BEST MODE TO CARRY OUT THE INVENTION

The constituting elements of the white organic electroluminescent element of the present invention (hereafter it is called as a white organic EL element of the present invention) will be described successively.

<<Color of Emitted Light and Front Luminance of Organic Electroluminescent Elements>>

Color of light emitted from the white organic electroluminescent element of the present invention and chemical compounds related to the above element is determined via a spectral radiation luminance meter CS-1000 (produced by Konica Minolta Sensing, Inc.) shown in FIG. 4.16 of page 108 of "Shinhen Shikisai Kagaku Handbook (Newly Edited Color Science Handbook" (edited by Nihon Shikisai Gakkai, published by Tokyo Daigaku Shuppan Kai, 1985), and the determined results are plotted onto the CIE chromaticity diagram, whereby color is determined. Preferred chromaticity as a white organic electroluminescent element in the present invention is in the region at an x value of 0.37±0.1 and a y value of 0.37±0.07.

<Constituting Layers of Organic EL Element>

Specific examples of a preferable layer constitution of a white organic EL element of the present invention are shown below; however, the present invention is not limited thereto.

(i) anode/light emitting layer unit/electron transport layer/cathode (ii) anode/positive hole transport layer/light emitting layer unit/electron transport layer/cathode (iii) anode/positive hole transport layer/light emitting layer unit/positive hole inhibition layer/electron transport layer/cathode (iv) anode/positive hole transport layer/light emitting layer unit/positive hole inhibition layer/electron transport layer/cathode buffer layer/cathode (v) anode/anode buffer layer/positive hole transport layer/light emitting layer unit/positive hole inhibition layer/electron transport layer/cathode buffer layer/cathode In the white organic EL element of the present invention, the light emitting layer unit is composed of at least two light emitting layers, and non-light emitting inter layer may be provided between the light emitting layers.

<Light Emitting Layer>

The light emitting layer of the present invention is a layer, which emits light via recombination of electrons and positive holes injected from an electrode or a layer such as an electron transport layer or a positive hole transport layer. The emission portion may be present either within the emitting layer or at the interface between the emitting layer and an adjacent layer thereof.

The constitution of the light emitting layers of the present invention is not particularly limited as far as the requirements of the present are satisfied. When the number of the light emitting layers is 3 or more, there may be provided with a plurality of light emitting layers each having the same emission spectrum or a maximum emission wavelength.

The total thickness of the light emitting layer is not particularly limited. However, in view of the layer homogeneity, the minimization of application of unnecessary high voltage during light emission, and the stability enhancement of the emitted light color against the drive electric current, the layer thickness is regulated preferably in the range of 2 nm-200 nm, more preferably in the range of 5 nm-40 nm. The thickness of each light emitting layer is preferably controlled in the range of 2 nm-100 nm, and more preferably in the range of 5 nm-30 nm.

With regard to preparation of the light emitting layer, light emitting dopants and host compounds, described below, may be subjected to film formation via a conventional thin filming method such as a vacuum deposition method, a spin coating method, a casting method, an LB method, or an ink-jet method.

In the present invention, the light emitting layers include at least: a light emitting layer yielding a light of a maximum emission wavelength of 480 nm or less (hereinafter it is called as "a light emitting layer A") containing a phosphorescence emitting dopant exhibiting a maximum emission wavelength of 480 nm or less; and a light emitting layer yielding a light of a maximum emission wavelength of 510 nm or more (hereinafter it is called as "a light emitting layer B"), the light emitting layer B being placed between the light emitting layer A and the anode.

By placing the light emitting layers A and B in the above described order, the driving voltage can be reduced and a light emitting element more excellent in electric power efficiency can be produced. In addition, in order to realize further high electric power efficiency and a longer driving lifetime, the aforesaid light emitting layer A and the aforesaid light emitting layer B are preferably located in an adjacent position with each other.

In the present invention, it is preferable that the layer thickness of the light emitting layer B is smaller than the layer thickness of the light emitting layer A in order to achieve a high degree of electric power efficiency and producing a preferable chromaticity as a white light emitting element. Moreover, the layer thickness of the light emitting layer B is preferable to be 10 nm or less.

As a phosphorescence emitting dopant exhibiting a maximum emission wavelength of 480 nm or less and contained in the light emitting layer A, it is preferable that the phosphorescence emitting dopant contains at least one of the partial structures represented by Formulas (A) to (C) from the viewpoint of electric power efficiency and chromaticity of white color. Further, in order to achieve a high color rendering property, it is preferable that the phosphorescence emitting dopant contained in the light emitting layer A exhibits a maximum emission wavelength of 465 nm or less.

In the present invention, a concentration of the phosphorescence emitting dopant contained in the light emitting layer A is characterized by being changed in a thickness direction of the light emitting layer A.

In order to change the concentration of the phosphorescence emitting dopant in the thickness direction, the following methods can be applied. For example, one of the methods is: to vary the evaporation deposition rate of the phosphorescence emitting dopant with keeping the evaporation deposition rate of the host material to be constant during the step of forming the light emitting layer by a co-deposition method. Another method is: to keep the evaporation deposition rate of the phosphorescence emitting dopant to be constant with varying the evaporation deposition rate of the host material. And further method is: to vary both the evaporation deposition rate of the phosphorescence emitting dopant and the evaporation deposition rate of the host material at the same time. In addition, the change of concentration can be made continuously or stepwise by controlling the way to change of the evaporation deposition rate.

Further, it is preferable that the concentration of the phosphorescence emitting dopant is decreased from a side of the anode to a side of the cathode in a thickness direction of the light emitting layer A so as to prevent the chromaticity change after a prolonged driving time. In this case, it is more preferable that the following relationship is satisfied: $\alpha/\beta \geq 1.5$, in which $\alpha$ (weight %) is the concentration of the dopant in the light emitting layer A at a side of the anode, and $\beta$ (weight %) is the concentration of the dopant in the light emitting layer A at a side of the cathode.

The mode of decrease of the concentration of the dopant may be continuous or stepwise in the direction from the anode to the cathode. However, the continuous decrease is preferable. The total content of the phosphorescence emitting dopant contained in the light emitting layer A is preferably from 2 weight % to 20 weight %, and is more preferably from 7 weight to 15 weight %. When the content is less than 2 weight %, the light emission efficiency will be decreased. And when the content is more than 20 weight %, a good result of a prolonged driving lifetime cannot be obtained.

The aforesaid light emitting layer B is characterized by containing a phosphorescence emitting dopant which exhibits a maximum emission wavelength of 510 nm or more. It is further preferable that the light emitting layer B contains at least two phosphorescence emitting dopants having a different maximum emission wavelength in an amount of 30 nm or more from the viewpoint of white color chromaticity and color rendering property.

(Host Compound)

A host compound (it is also called as a light emitting host compound) which is incorporated in an emitting layer of the present invention will be described.

"Host compounds" incorporated in a white organic EL element of the present invention, are preferably the compounds which exhibit a phosphorescent quantum yield of the phosphorescence emission of less than 0.1, and more preferably the compounds which exhibit a phosphorescent quantum yield of the phosphorescence emission of less than 0.01. The amount the host compound is preferably at least 20 weight % in the emitting layer.

Structures of the light emitting host compounds employed in the present invention are not particularly limited. Representative examples include carbazole derivatives, triarylamine derivatives, aromatic borane derivatives, nitrogen-containing heterocyclic compounds, thiophene derivatives, furan derivatives, compounds having a basic skeleton of oligoarylene compounds, carboline derivatives, diazacarbazole derivatives (those in which at least one of the carbon atoms of the hydrocarbon ring which constitutes a carboline ring of carboline derivatives is replaced with a nitrogen atom).

Further, a host compound used in the present invention may be either a low molecular weight compound or a polymer compound having a repeating unit, further it may be a low molecular weight compound provided with a polymerizing group such as a vinyl group and an epoxy group (an evaporation polymerizing emission host).

The compounds represented by the aforesaid Formula (a) are preferably employed as light emitting host compounds in the light emitting layer according to the present invention.

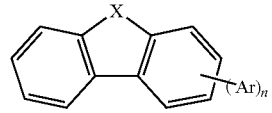

Formula (a)

In the aforesaid Formula (a), X represents NR', O, S, CR'R" or SiR'R", R' and R" each represent a hydrogen atom or a substituent; Ar represents an aromatic ring; and n is an integer of 0 to 8.

In Formula (a), examples of the substituents represented by R' and R" include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an alkenyl group (for example, a vinyl group, an allyl group, a 1-propenyl group, a 2-butenyl group, a 1,3-butadienyl group, a 2-pentenyl group and an isopropenyl group); an alkynyl group (for example, an ethynyl group and a propargyl group); an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenyl group); an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group and a carbolinyl group, a diazacarbazolyl group (indicating a group in which one of the carbon atoms constituting the carboline ring of the above carbolinyl group is replaced with a nitrogen atom) and a phtharazinyl group); a heterocyclic group (for example, a pyrrolidyl group, an imidazolidyl group, a morpholyl group, and an oxazilidyl group); an alkoxyl group (for example, a methoxy group, an ethoxy group, a propyloxy group, a pentyloxy group, an hexyloxy group, an octyloxy group and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); an acyloxy group (for example, an acetyloxy group, an ethylcarbonyloxy group, a butylcarbonyloxy group, an octylcarbonyloxy group, a dodecylcarbonyloxy group and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylaminn group, a 2-ethylhexylcarbonylamino group, an octylcarbonylamino group, a dodecylcarbonylamino group, a phenylcarbonylamino group and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group and a dodecylsulfonyl group); an arylsulfonyl group or a heteroarylsulfonyl group (for example, a phenylsulfonyl group, a naphthylsulfonyl group and a 2-pyridylsulfonyl group); an amino group (for example, an amino group, an ethylamino group, a dimethylamino group, a butylamino group, a cyclopentylamino group, a dodecylamino group, an anilino group, a naphthylamino group, a 2-pyridylamino group, a piperidyl group (it is called as a piperidinyl group) and a 2,2,6,6-tetramethyl piperidinyl group); a halogen atom (foe example, a fluorine atom, a chlorine atom and a bromine atom); a fluorohydrocarbon group (for example, a fluoromethyl group, a trifluoromethyl group, a pentafluoroethyl group and a pentafluorophenyl group); a cyano group; a nitro group; a hydroxyl group; a mercapto group; a silyl group (for example, a trimethylsilyl group, a triisopropylsilyl group, a triphenylsilyl group and a phenyldiethylsilyl group); a phosphate group (for example, dihexylphosphoryl group); a phosphite group (for example, diphenylphosphinyl group); and a phosphono group.

These substituents may further be substituted with the aforesaid substituents. Further, a plurality of these substituents may mutually be joined to form a ring.

In Formula (a), X is preferably NR' or O, and R' is especially preferable to be an aromatic hydrocarbon group or an aromatic heterocycle.

In Formula (a), examples of an aromatic ring represented by Ar are an aromatic hydrocarbon ring and an aromatic heterocycle. The aforesaid aromatic ring may be a single ring or a condensed ring, and further, it may be unsubstituted or may be substituted with the substituent as described below.

In Formula (a), examples of an aromatic hydrocarbon ring represented by Ar are as follows: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring, an anthraanthrene ring. These rings may further have a substituent.

In Formula (a), examples of an aromatic heterocycle represented by Ar are as follows: a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a triazole ring, an indole ring, an indazole ring, a benzimidazole ring, a benzothiazole ring, a benzooxazole ring, a quinoxaline ring, a quinazoline ring, a cinnoline ring, a quinoline ring, an isoquinoline ring, a phthalazine ring naphthylidine ring, a carbazole ring, a carboline ring, a diazacarbazole ring ((indicating a group in which one of the carbon atoms constituting the carboline ring of the above carbolinyl group is replaced with a nitrogen atom). These rings may further have a substituent.

Among these rings, preferably used as an aromatic ring represented by Ar in Formula (a) are: a carbazole ring, a carboline ring, a dibenzofuran ring, and benzene ring. Especially preferable rings are: a carbazole ring, a carboline ring, and benzene ring. Among these, a benzene ring having a substituent is more preferable, and in particular, a benzene ring having a carbazolyl group is most desirable.

Moreover, in Formula (a), preferable examples of an aromatic ring represented by Ar are condensed rings with three or more rings, and specific examples of a condensed aromatic hydrocarbon ring having three or more rings are: a naphthacene ring, an anthracene ring, a tetracene ring, a pentacene ring, a hexacene ring, a phenanthrene ring, a pyrene ring, a benzopyrene ring, a benzoazulene ring, a chrysene ring, a benzochrysene ring, an acenaphthene ring, an acenaphthylene ring, a triphenylene ring, a coronene ring, a benzocoronene ring, a hexabenzocorone ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, an anthraanthrene ring. In addition, these rings may further have a substituent.

Moreover, examples of a condensed aromatic heterocycle having three or more rings are: an acridine ring, a benzoquinoline ring, a carbazole ring, a carboline ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring structure in which one of the carbon atoms constituting the carboline ring is replaced with a nitrogen atom), a phenanthroline ring, a dibenzofuran ring, a dibenzothiophene ring, a naphthofuran ring, a naphthothiophene ring, a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, and a thiophanthrene ring (naphthothiophene ring). These rings may further have a substituent.

Here, in Formula (a), the substituents which an aromatic ring represented by Ar may have are synonymous with the substituents represented by R' or R".

Moreover, in Formula (a), although n represents an integer of 0 to 8, n is preferably an integer of 0 to 2. Especially, when X is O or S, it is preferable that n is 1 or 2.

Examples of a luminescence host compound represented by Formula (a) are shown below. However, the present invention is not limited to these.

1-1

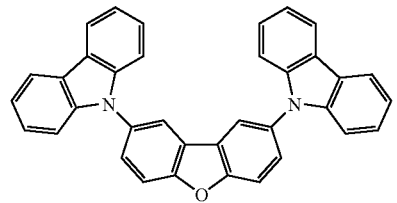

1-2

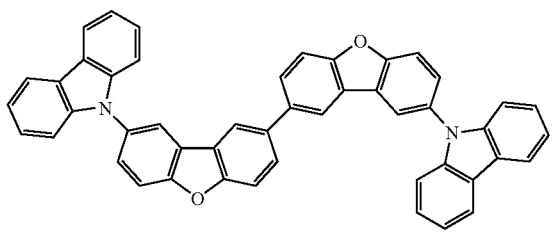

1-3

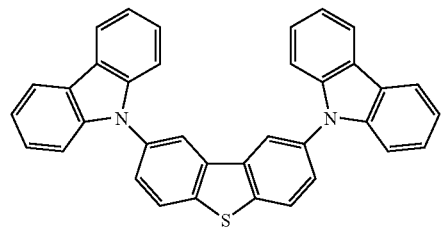

1-4

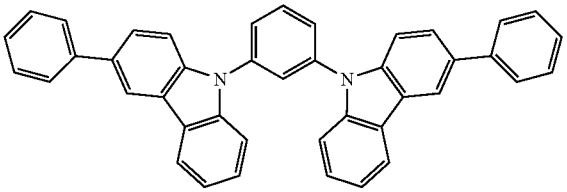

1-5

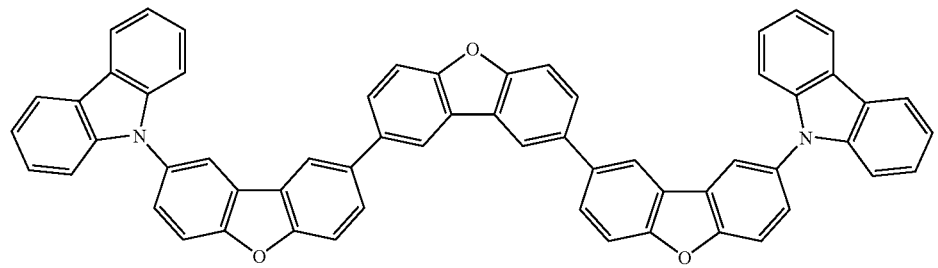

1-6

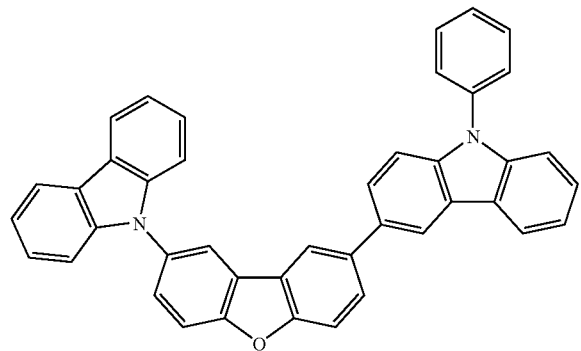

1-7
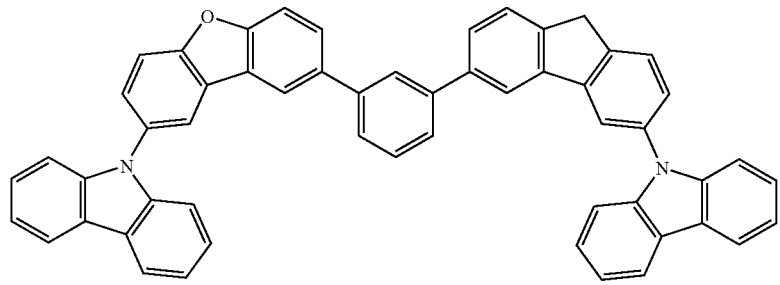
1-8
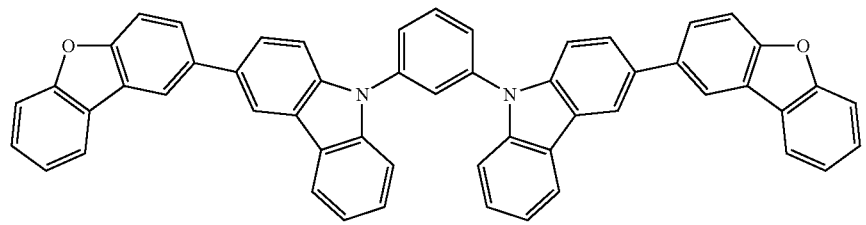
1-9
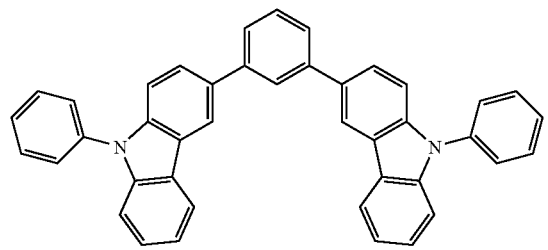
1-10
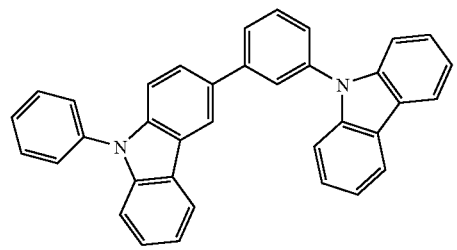
1-11
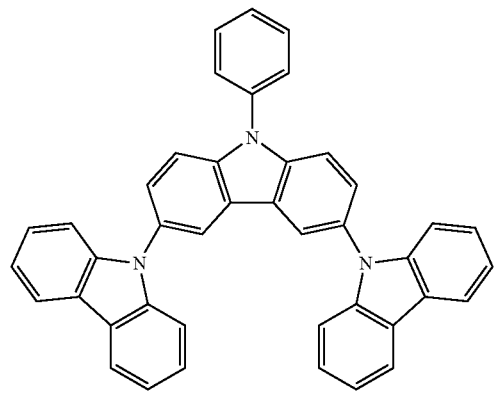
1-12
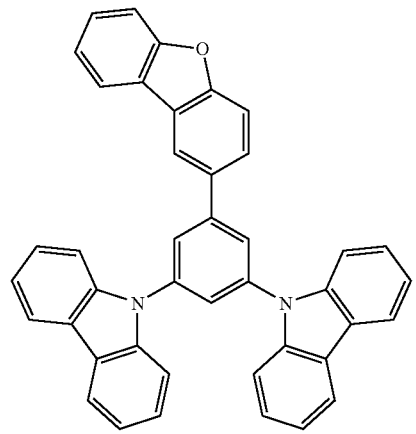
1-13
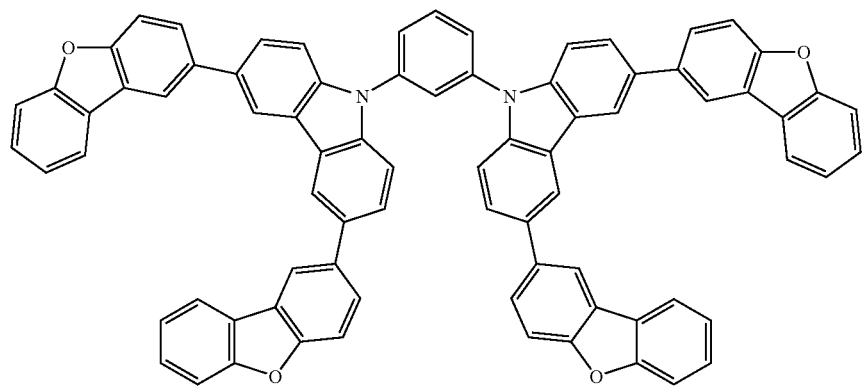

-continued
1-14
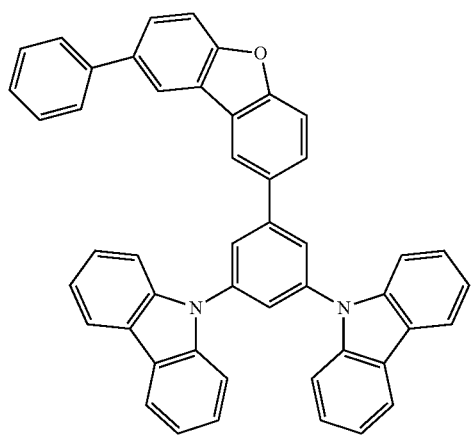
1-15
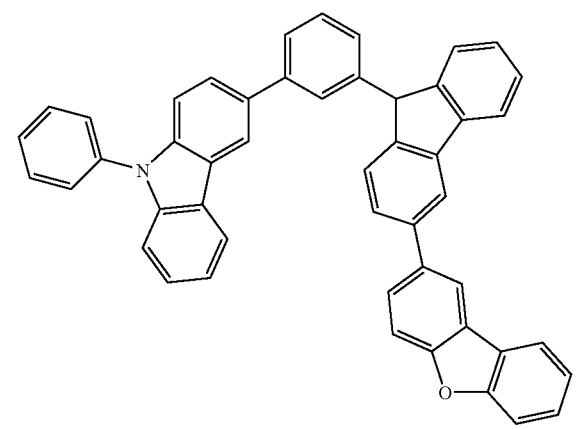
1-16
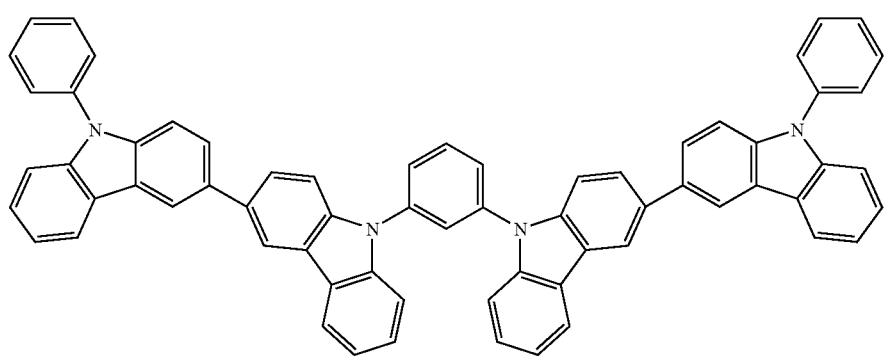
1-17
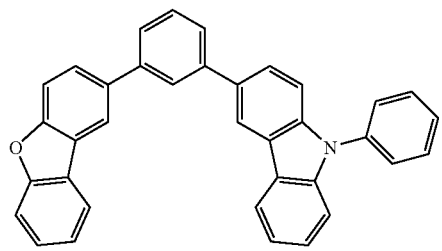
1-18
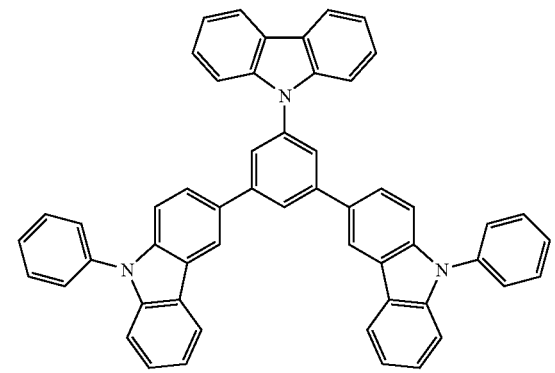
1-19
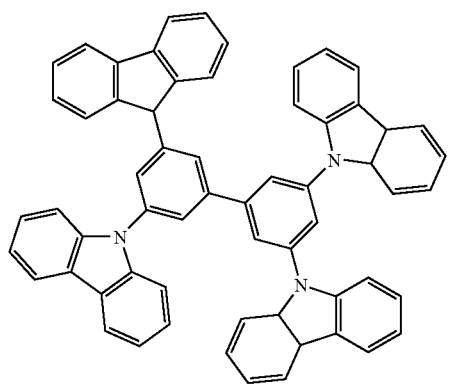
1-20
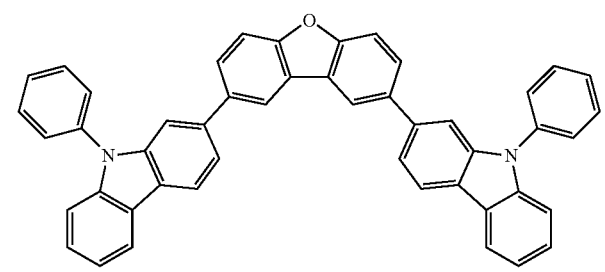

1-21
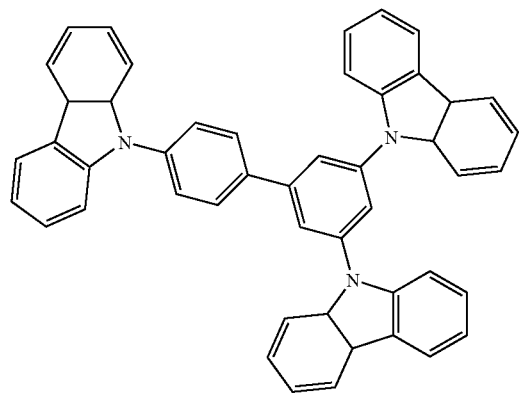
1-22
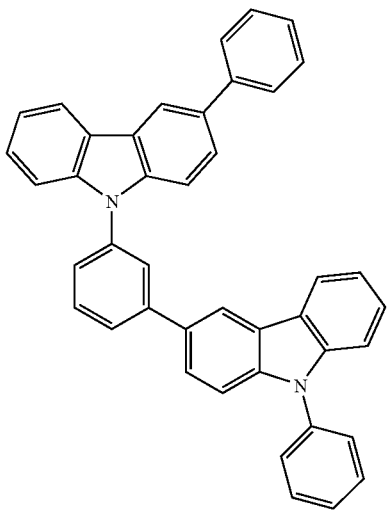
1-23
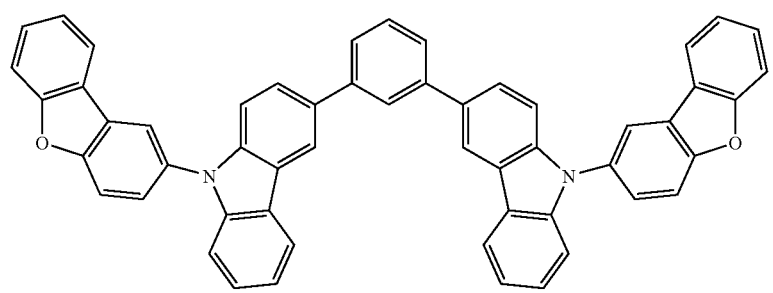
1-24
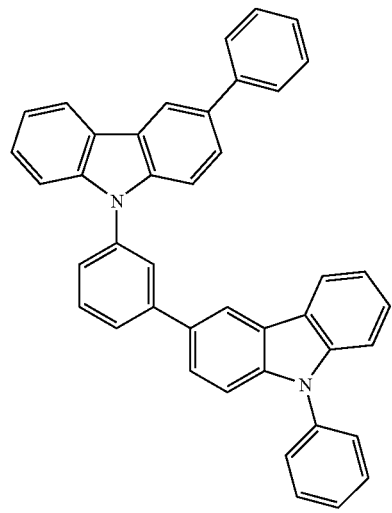
1-25
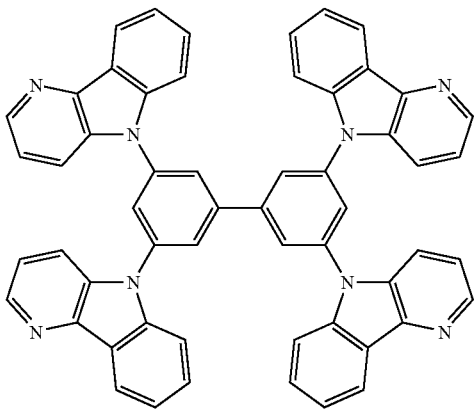

-continued
1-26
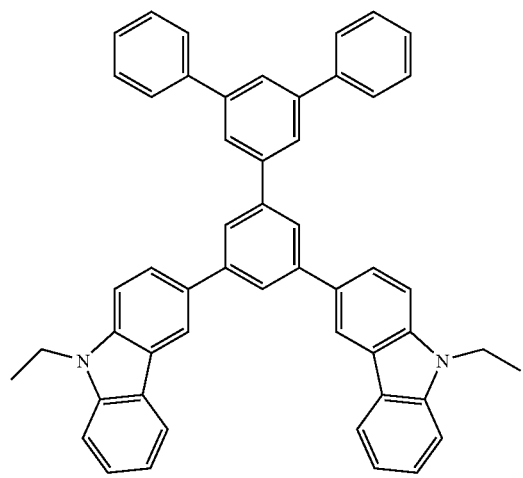
1-27
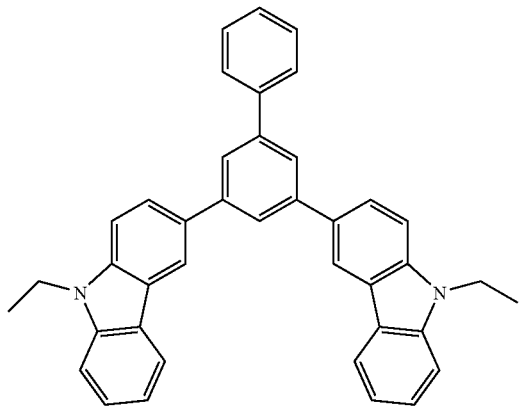
1-28
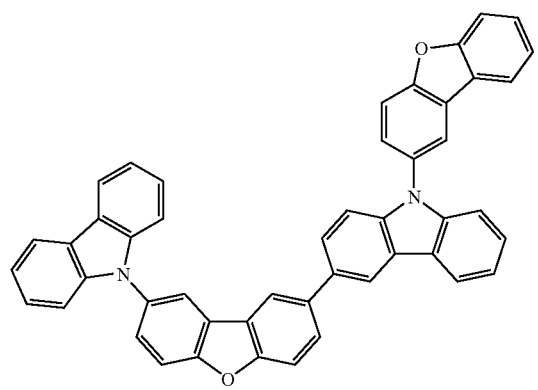
1-29
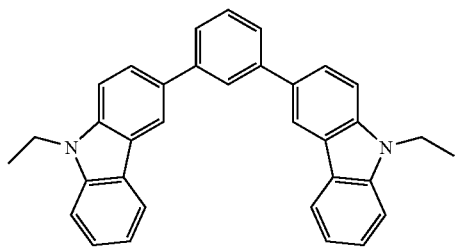
1-30
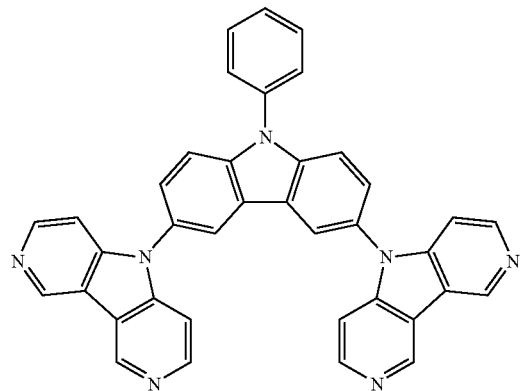
1-31
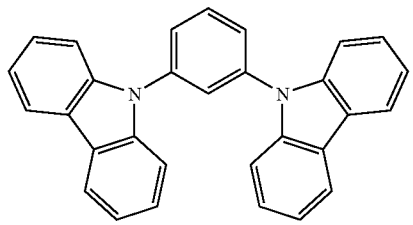

-continued
1-32
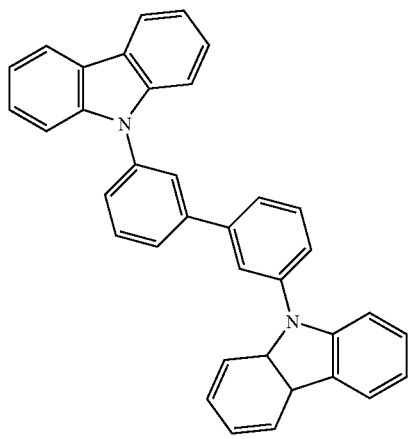
1-33
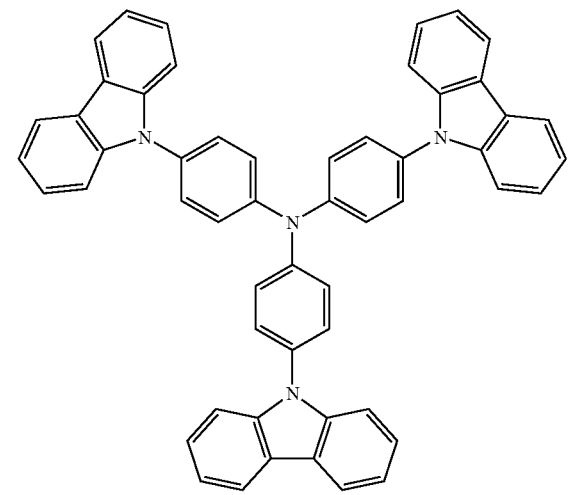
1-34
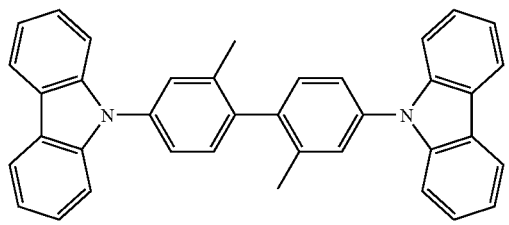
1-35
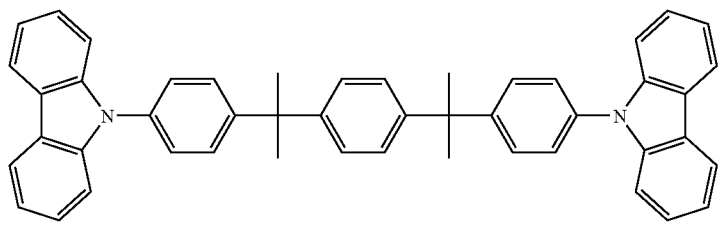
1-36
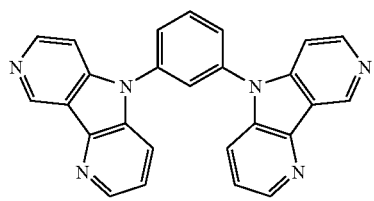
1-37
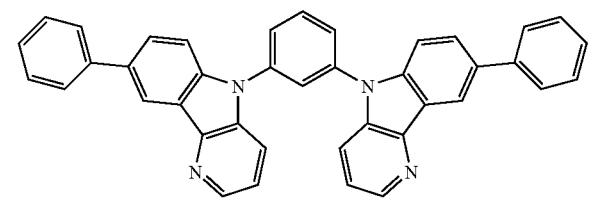
1-38
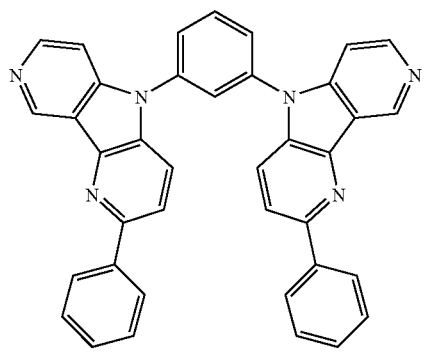
1-39
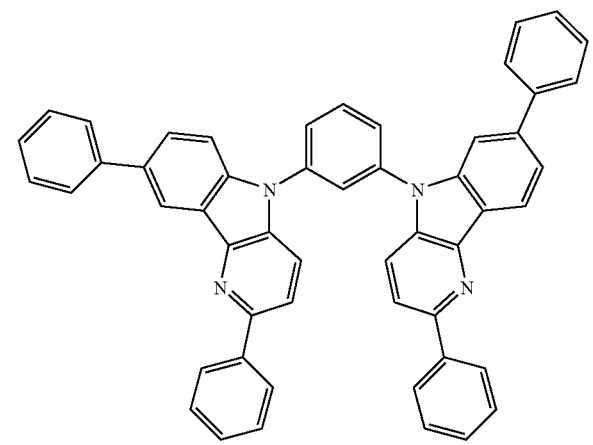

-continued
1-40
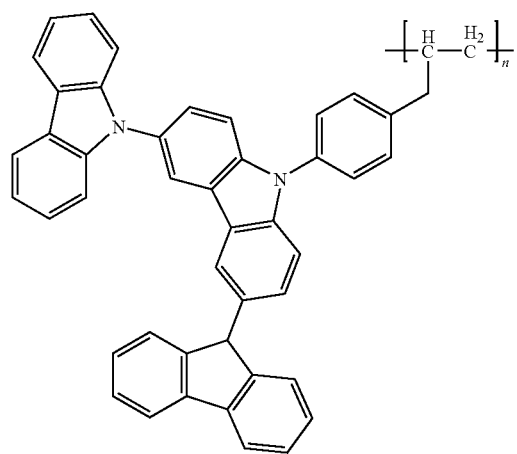
1-41
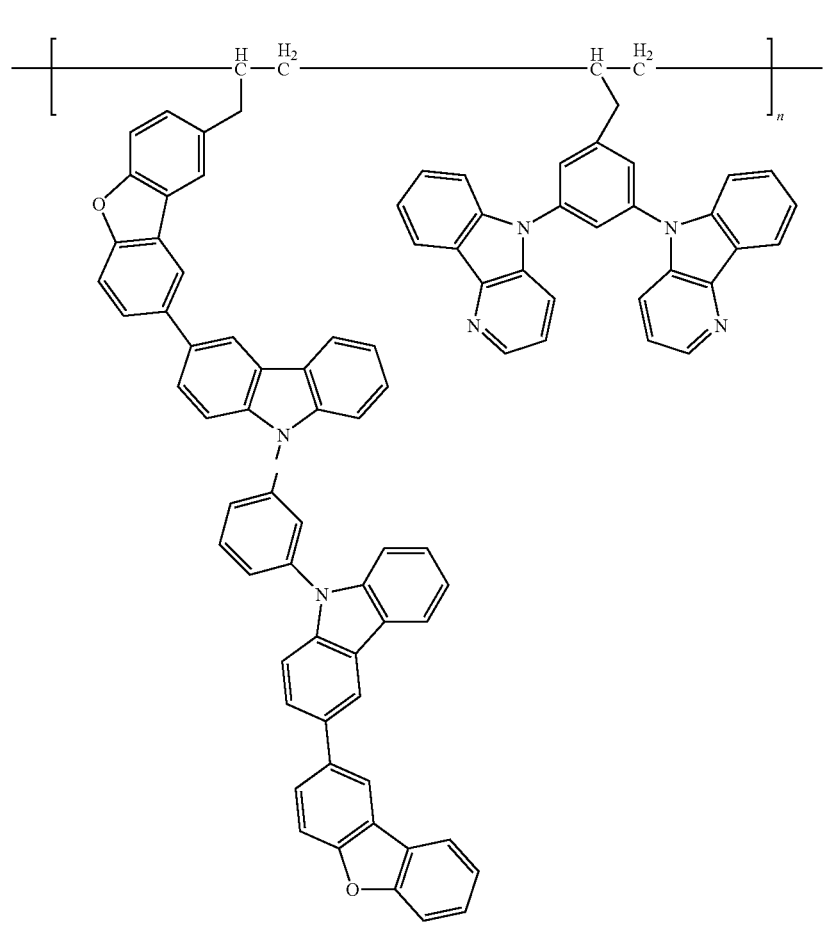

-continued

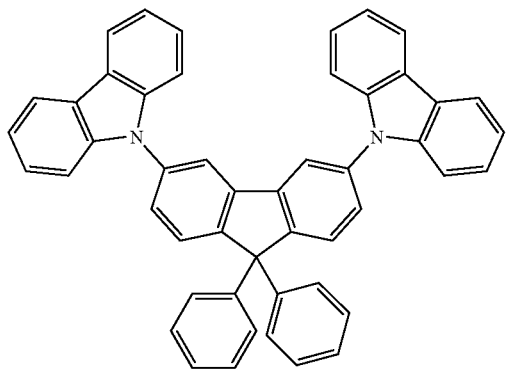
1-42

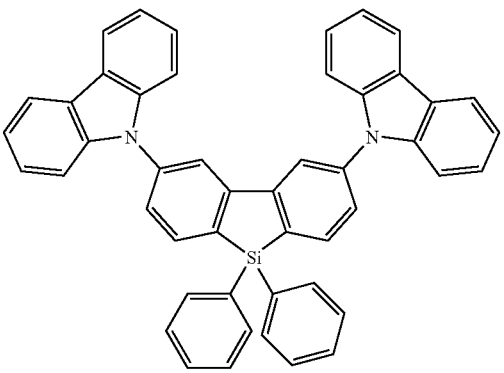
1-43

As specific examples of a host compound, the compounds described in the following documents are preferable.

For example the followings can be cited: JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

As a host compound of the present invention, a single host compound may be used, but two or more sorts of known host compounds may be used together. In the present invention, it is preferable that the same host compound is contained in both the aforesaid light emitting layer A and the aforesaid light emitting layer B in an amount of 30 weight % or more based on the weight of each light emitting layer.

A host compound of the present invention is preferably a compound having a positive hole transporting ability and an electron transporting ability, as well as preventing elongation of an emission wavelength and having a high Tg (a glass transition temperature). In the present invention, the glass transition temperature of the host compounds is preferably at least 90° C., and is more preferably at least 130° C. in view of realizing a longer driving lifetime and excellent durability.

Glass transition point (Tg), as described herein, is the value which is determined based on the method specified in JIS K 7121, employing DSC (Differential Scanning Calorimetry).

Further, in view of realizing higher light emission efficiency, it is preferable that the lowest excited triplet energy ($T_1$) of the host compounds is at least 2.7 eV. Lowest excited triplet energy, as described in the present invention, refers to the peak energy of the light emission band corresponding to the transition between the lowest vibrational bands of the phosphorescence emission spectra which is observed at liquid nitrogen by dissolving a host compound in solvents.

In the white organic EL element of the present invention, since host materials achieve transportation of carriers, materials are preferred which are capable of transporting carriers. Carrier mobility is employed as a physical characteristic to represent the transportability of carriers. It is commonly noted that the carrier mobility of organic materials depends on electric field strength. Since materials which highly depend on the electric field strength tend to destroy the balance of the injection and transportation of positive holes and electrons, it is preferable to employ, as the interlayer materials and the host materials, those of which mobility exhibits minimal dependence on the electric field strength.

(Phosphorescence Emitting Dopant)

The present invention is characterized by using a phosphorescence emitting dopant as a light emitting dopant. In the organic electroluminescent element of the present invention, it is contained at least a phosphorescence emitting dopant yielding a maximum emission wavelength of 480 nm or less. More preferably, it is contained a phosphorescence emitting dopant having at least one of partial structures represented by any one of Formulas (A) to (C).

A phosphorescence emitting dopant of the present invention is a compound, wherein emission from an excited triplet state thereof is observed, specifically, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescence-emitting dopant of the present invention to exhibit the above phosphorescence quantum yield (at least 0.01) using any of the appropriate solvents.

Two kinds of principles regarding emission of a phosphorescence emitting dopant are cited. One is an energy transfer-type, wherein carriers recombine on a host compound on which the carriers are transferred to produce an excited state of the host compound, and then via transfer of this energy to a phosphorescence-emitting dopant, emission from the phosphorescence-emitting dopant is realized. The other is a carrier trap-type, wherein a phosphorescence-emitting dopant serves as a carrier trap and then carriers recombine on the phosphorescence emitting dopant to generate emission from the phosphorescence emitting dopant. In each case, the excited state energy of the phosphorescence emitting dopant is required to be lower than that of the host compound.

The phosphorescence emitting dopants according to the present invention are complex based compounds which incorporate preferably metals in Groups 8-10 of the element periodic table, more preferably iridium compounds, osmium compounds, platinum compounds (platinum complex based compounds), and rare earth metal complexes, and of these, most preferred are iridium compounds.

Example compounds which are used for a phosphorescence emitting dopant are shown below, however, the present invention is not limited to them. These compounds can be synthesized by the methods disclosed in, for example, Inorg. Chem. 40, 1704-1711.
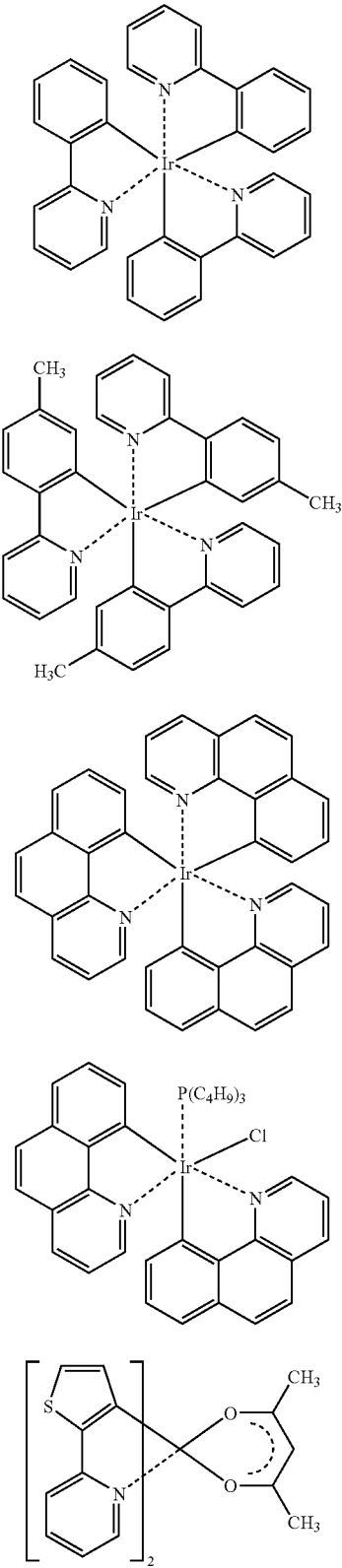
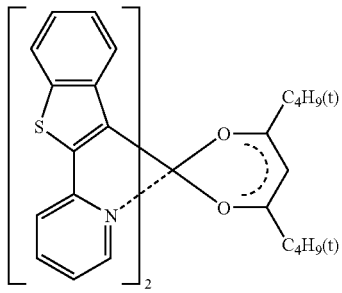
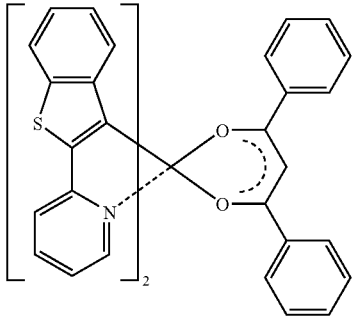
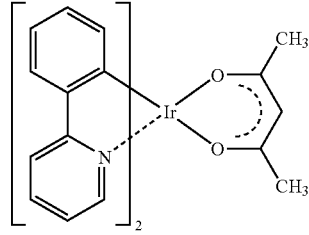
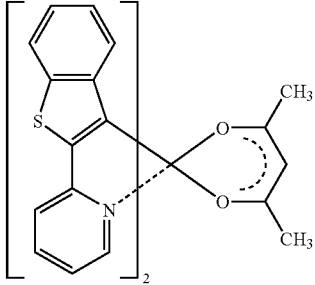
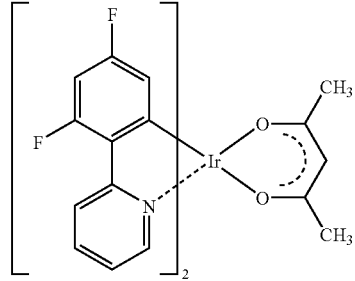

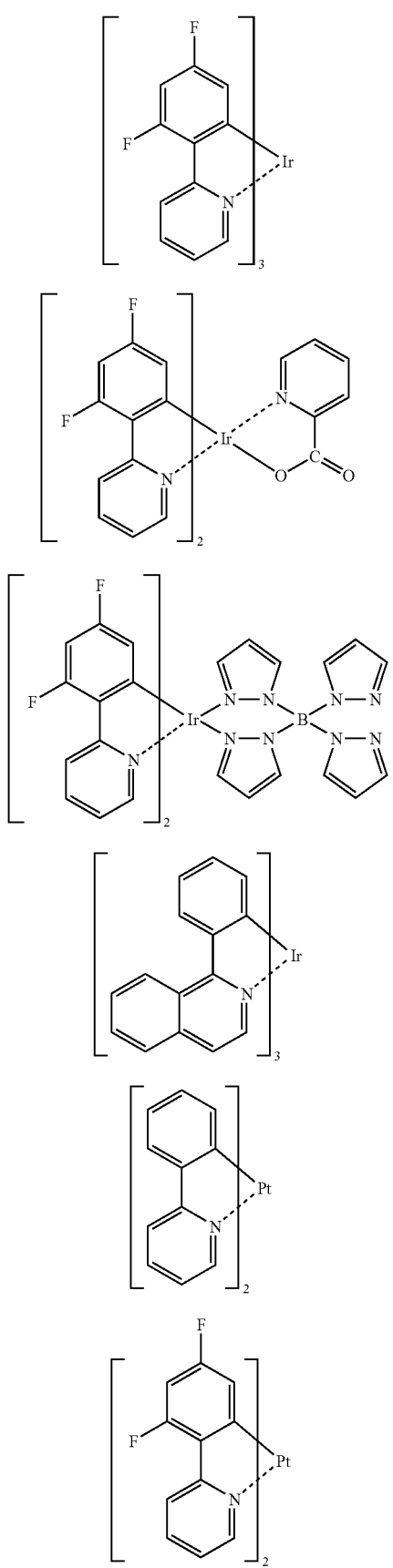
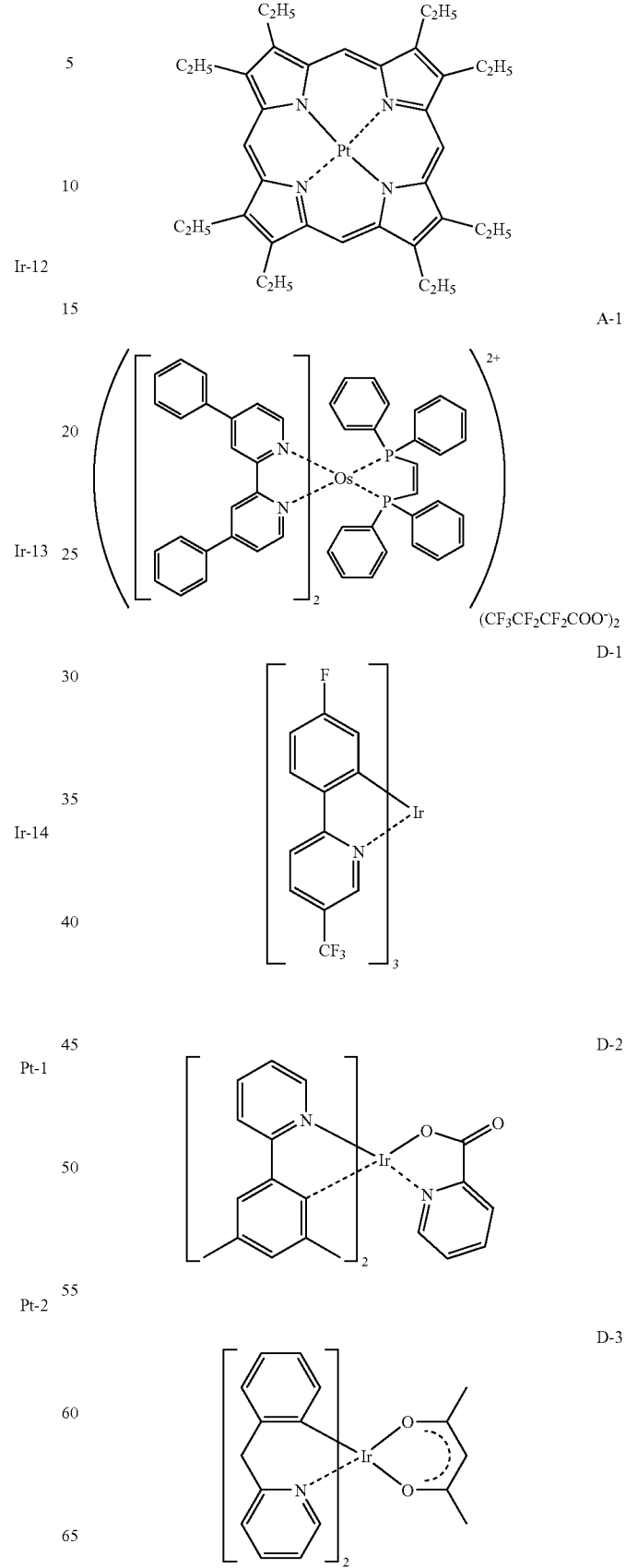

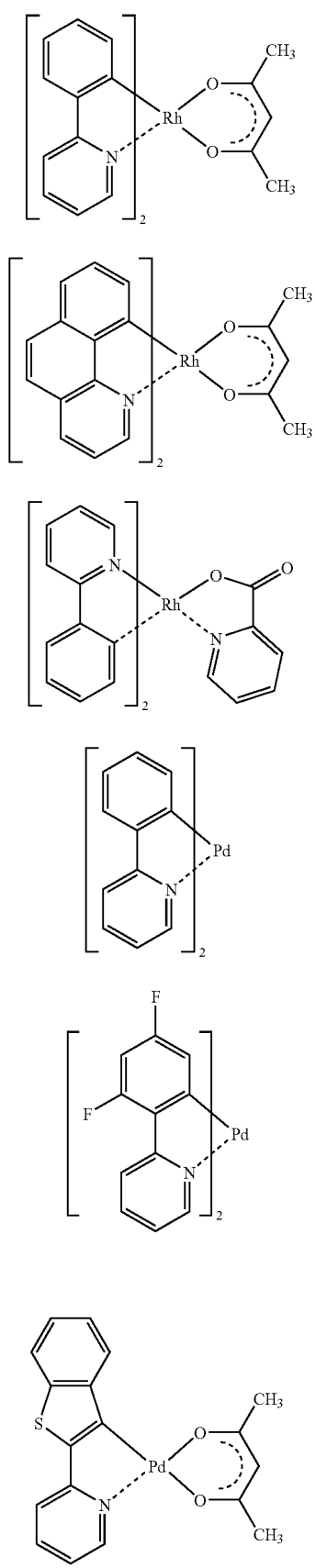
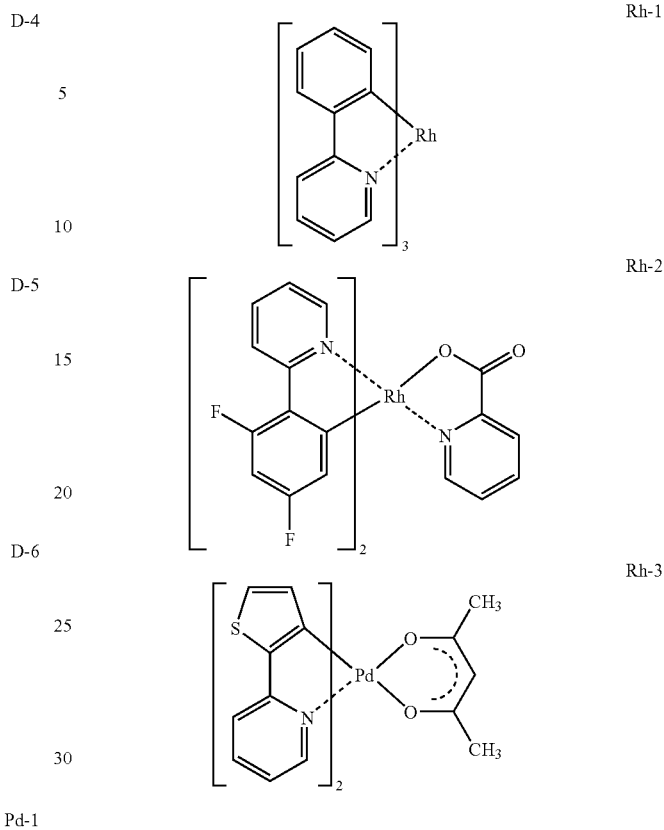

A phosphorescence emitting dopant can be suitably selected from the known compounds used in a light emitting layer of an organic EL element. In the organic electroluminescent element of the present invention, there is contained at least one phosphorescence emitting dopant yielding a maximum emission wavelength of 480 nm or less. More preferably, there is contained a phosphorescence emitting dopant yielding a maximum emission wavelength of 480 nm or less and having at least one of partial structures represented by any one of Formulas (A) to (C).

In the aforesaid Formula (A), Ra represents a hydrogen atom, an aliphatic group, an aromatic group or a heterocyclic group; Rb and Rc each represent a hydrogen atom or a substituent; A1 represents a group of atoms necessary to form an aromatic ring or an aromatic heterocyclic ring; and M represents Ir or Pt.

Further, in the aforesaid Formula (B), Ra represents a hydrogen atom, an aliphatic group, an aromatic group or a heterocyclic group; Rb, Rc, Rb$_1$ and Rc$_1$ each represent a hydrogen atom or a substituent; A1 represents a group of atoms necessary to form an aromatic ring or an aromatic heterocyclic ring; and M represents Ir or Pt.

Further, in the aforesaid Formula (C), Ra represents a hydrogen atom, an aliphatic group, an aromatic group or a heterocyclic group; Rb and Rc each represent a hydrogen atom or a substituent; A1 represents a group of atoms necessary to form an aromatic ring or an aromatic heterocyclic ring; and M represents Ir or Pt.

In Formulas (A) to (C), Ra represents a hydrogen atom, an aliphatic group, an aromatic group or a heterocyclic group. Examples of an aliphatic group represented by Ra include: an alkyl group (for example, a methyl group, an ethyl group, a propyl group, a butyl group, a pentyl group, an isopentyl group, a 2-ethyl-hexyl group, an octyl group, an undecyl group, a dodecyl group and a tetradecyl group); a cycloalkyl group (for example, a cyclopentyl group and a cyclohexyl group); an aromatic group (for example, a phenyl group, a tolyl group, an azulenyl group, an anthranyl group, a phenanthryl group, a pyrenyl group, a crycenyl group, a naphthacenyl group, o-terphenyl group, m-terphenyl group, p-terphenyl group, an acenaphthenyl group, a coronenyl group, a fluorenyl group and a perirenyl group); a heterocyclic group (for example, a pyrrolyl group, an indolyl group, a furyl group, a thienyl group, an imidazolyl group, a pyrazolyl group, an indolidinyl group, a quinolinyl group, a carbazolyl group, an indolinyl group, a thiazolyl group, a pyridyl group, a pyridazinyl group, a thiadiazinyl group, an oxadiazolyl group, a benzoquinilinyl group, a thiadiazolyl group, a pyrrolothiazolyl group, a pyrrolopyridazinyl group, a tetrazolyl group, an oxazolyl group and a cromanyl group). These groups each may have a substituent.

In Formulas (A) to (C), examples of the substituents represented by Rb, Rc, $Rb_1$, and $Rc_1$ include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an alkenyl group (for example, a vinyl group and an allyl group); an alkynyl group (for example, an ethynyl group and a propargyl group); an aryl group (a phenyl group and a naphtyl group); an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a phthalazinyl group); a heterocyclic group (for example, a pyrrolidyl group, an imidazolidyl group, a morpholyl group, and an oxazolidyl group); an alkoxyl group (for example, a methoxy group, an ethoxy group, a propyloxy group, a pentyloxy group, an hexyloxy group, an octyloxy group and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycaxbonyl group, an octyloxycarbonyl group and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); an acyloxy group (for example, an acetyloxy group, an ethylcarbonyloxy group, a butylcarbonyloxy group, an octylcarbonyloxy group, a dodecylcarbonyloxy group and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group); an alkylsulfonyl group (for example, a methylsulfonyl group, an ethylsulfonyl group, a butylsulfinyl group, a cyclohexylsulfinyl group, a 2-ethylhexylsulfonyl group and a dodecylsulfonyl group); an arylsulfonyl group or a heteroarylsulfonyl group (for example, a phenylsulfonyl group, a naphthylsulfonyl group and a 2-pyridylsulfonyl group); an amino group (for example, an amino group, an ethylamino group, a dimethylamino group, a butylamino group, a cyclopentylamino group, a dodecylamino group, an anilino group, a naphthylamino group, a 2-pyridylamino group, a piperidyl group (it is called as a piperidinyl group) and a 2,2,6,6-tetramethyl piperidinyl group); a halogen atom (foe example, a fluorine atom, a chlorine atom and a bromine atom); a fluorohydrocarbon group (for example, a fluoromethyl group, a trifluoromethyl group, a pentafluoroethyl group and a pentafluorophenyl group); a cyano group; a nitro group; a hydroxyl group; a mercapto group; and a silyl group (for example, a trimethylsilyl group, a triisopropylsilyl group, a triphenylsilyl group and a phenyldiethylsilyl group). These groups each may further be substituted with a substituent as described above.

In Formulas (A) to (C), A1 represents a residue required to form an aromatic ring or an aromatic heterocycle. Examples of an aromatic ring include: a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring, an anthraanthrene ring.

Examples of an aromatic heterocycle include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzooxazole ring, a quinoxaline ring, a quinazoline ring, a phthalazine ring naphthylidine ring, a carbazole ring, a carboline ring, a diazacarbazole ring (indicating a group in which one of the carbon atoms constituting the carboline ring of the above carbolinyl group is replaced with a nitrogen atom).

The structures of Formulas (A) to (C) are a partial structure, and it is required to have a ligand corresponding to the valence of the center metal so as to become a phosphorescence emitting dopant having a complete structure. Examples of a ligand include: a halogen atom (for example, a fluorine atom, a chlorine atom, a bromine atom and a iodine atom); an aryl group (for example, a phenyl group, p-chlorophenyl group, mesityl group, a tolyl group, a xylyl group, a biphenyl group, a naphtyl group, an anthryl group and a phenanthryl group); an alkyl group (for example, a methyl group, an ethyl group, an isopropyl group, a hydroxyethyl group, a methoxymethyl group, a trifluoromethyl group, and a tert-butyl group); an alkoxyl group; an aryloxy group; an alkylthio group; an arylthio group; an aromatic heterocyclic group ((for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group and a carbolinyl and a phthalazinyl group); and a partial structure formed by elimination a metal from Formulas (A) to (C).

In Formulas (A) to (C), M represents Ir or Pt, and Pt is most preferable. It is preferable a tris compound formed from 3 units of a partial structure of Formulas (A) to (C).

Examples of a phosphorescence emitting dopant of the present invention having a partial structure represented by Formulas (A) to (C) are shown below. However, the present invention is not limited by them.

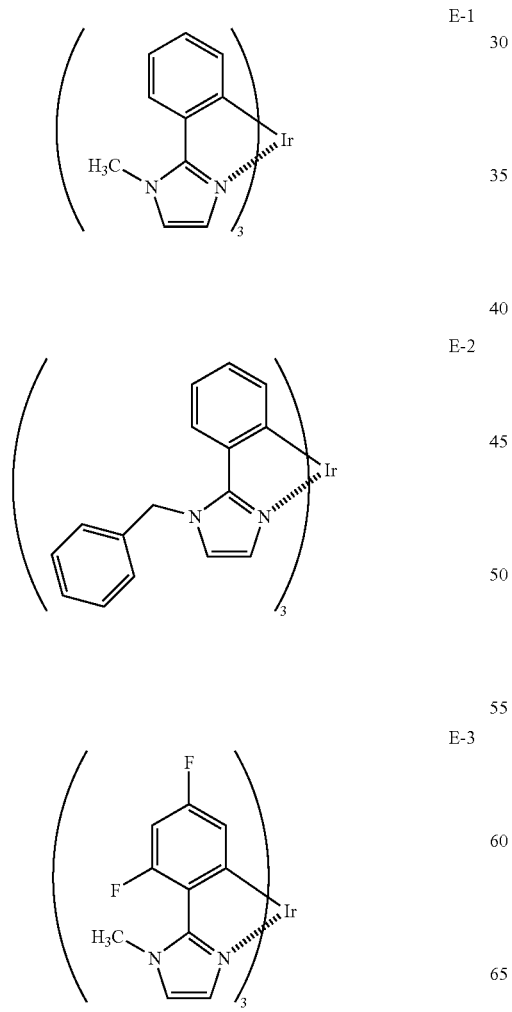

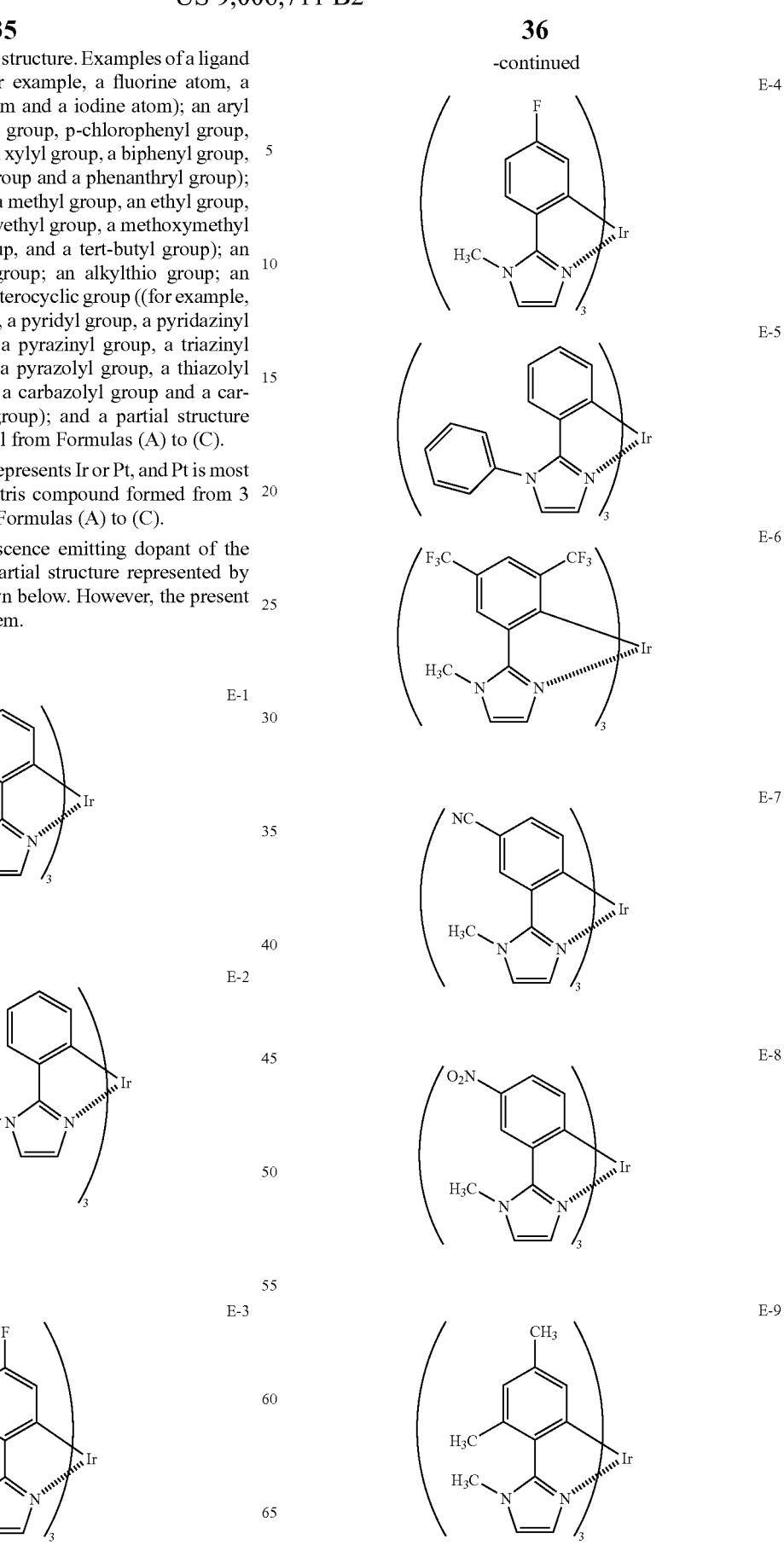

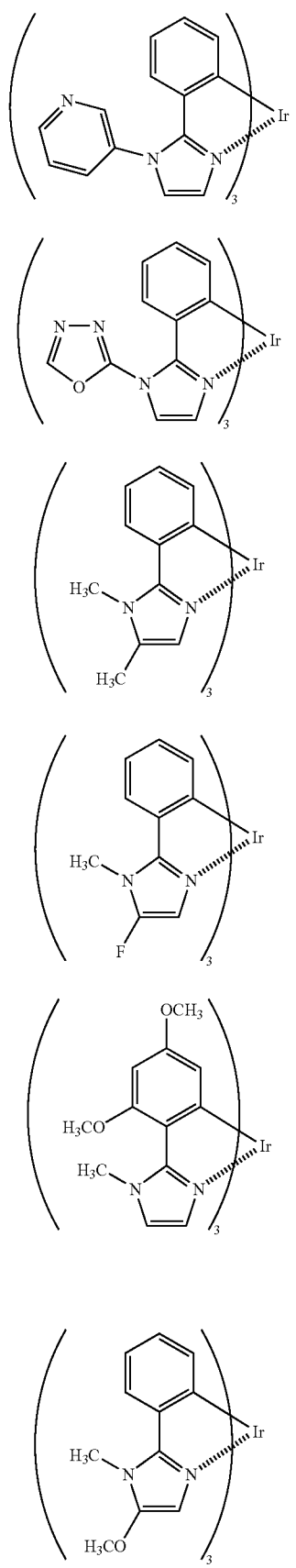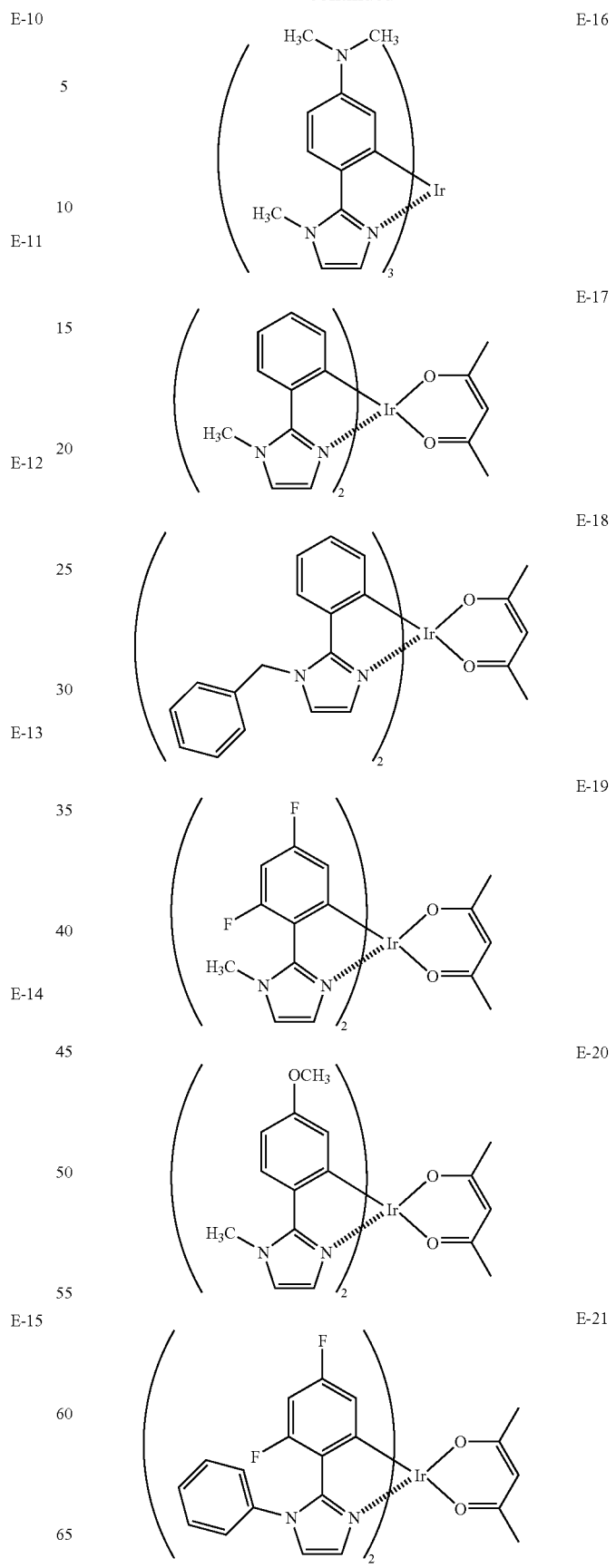

E-22
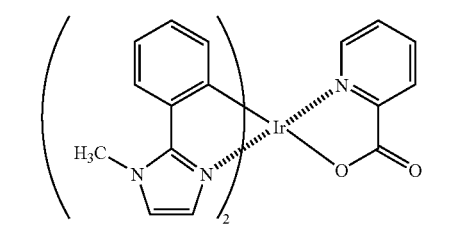
E-23
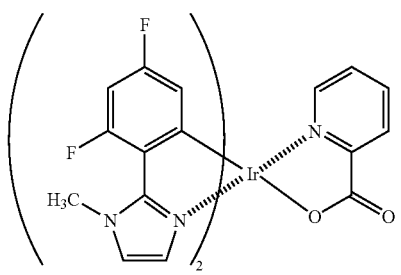
E-24
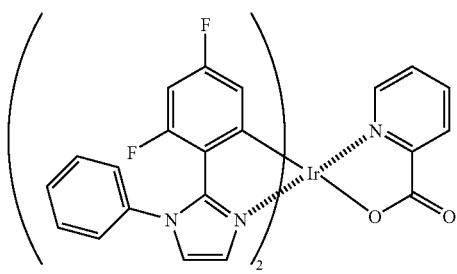
E-25
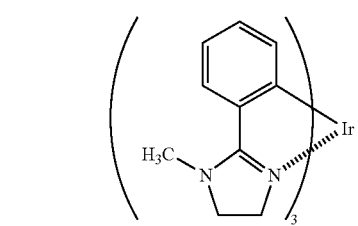
E-26
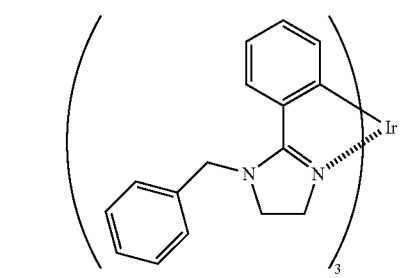
E-27
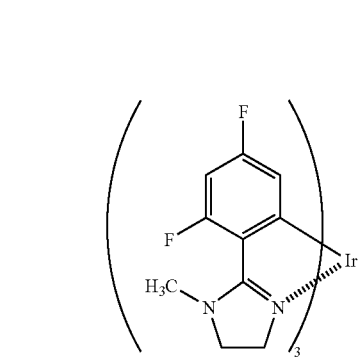
E-28
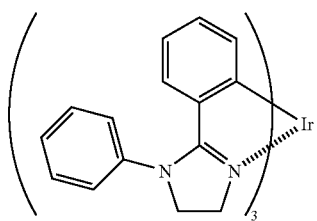
E-29
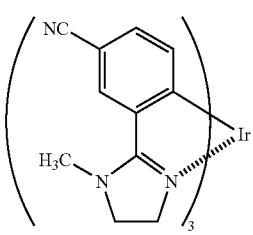
E-30
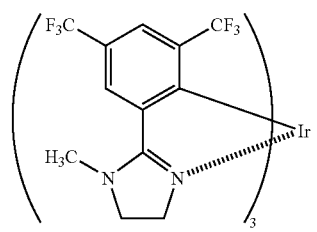
E-31
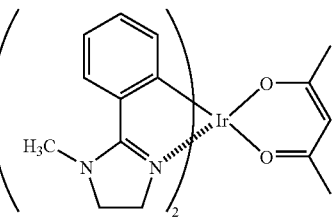
E-32
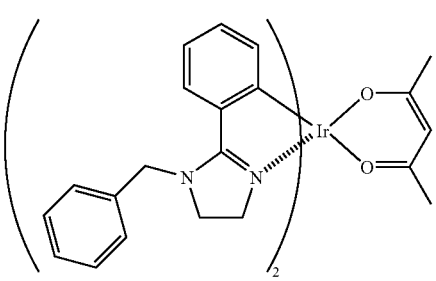
E-33
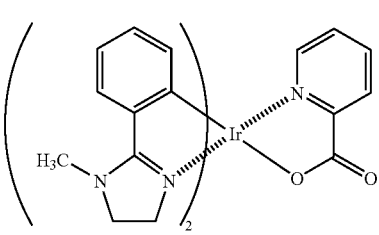

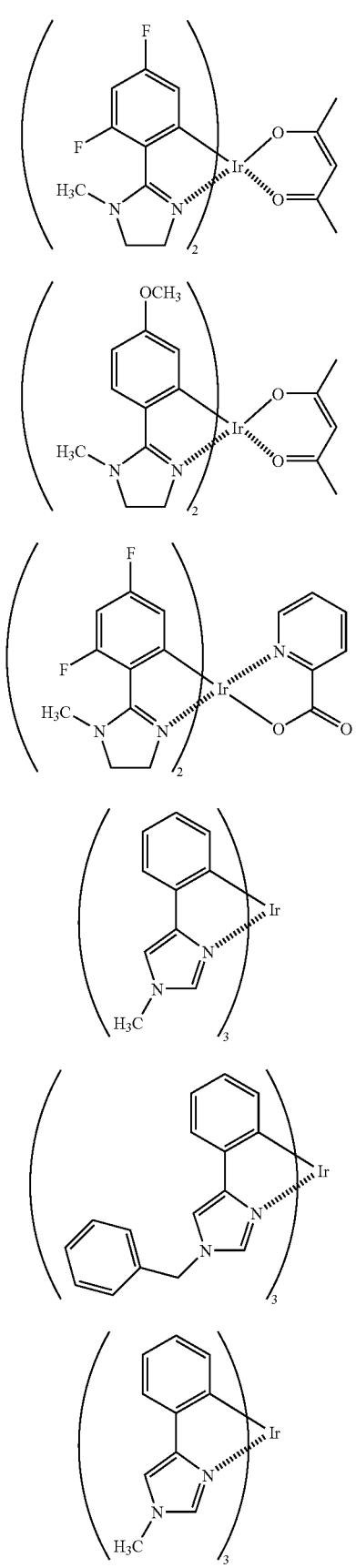
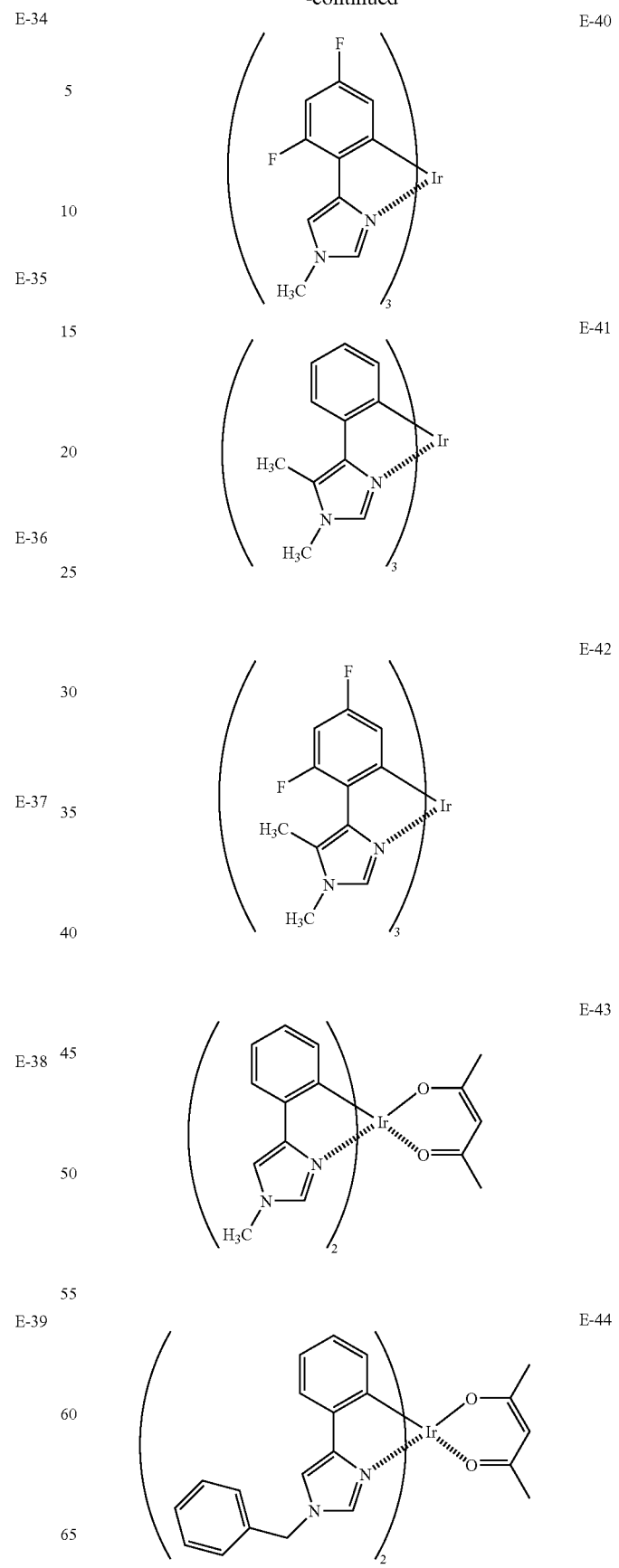

E-45, E-46, E-47, E-48, E-49, E-50, E-51, E-52, E-53, E-54

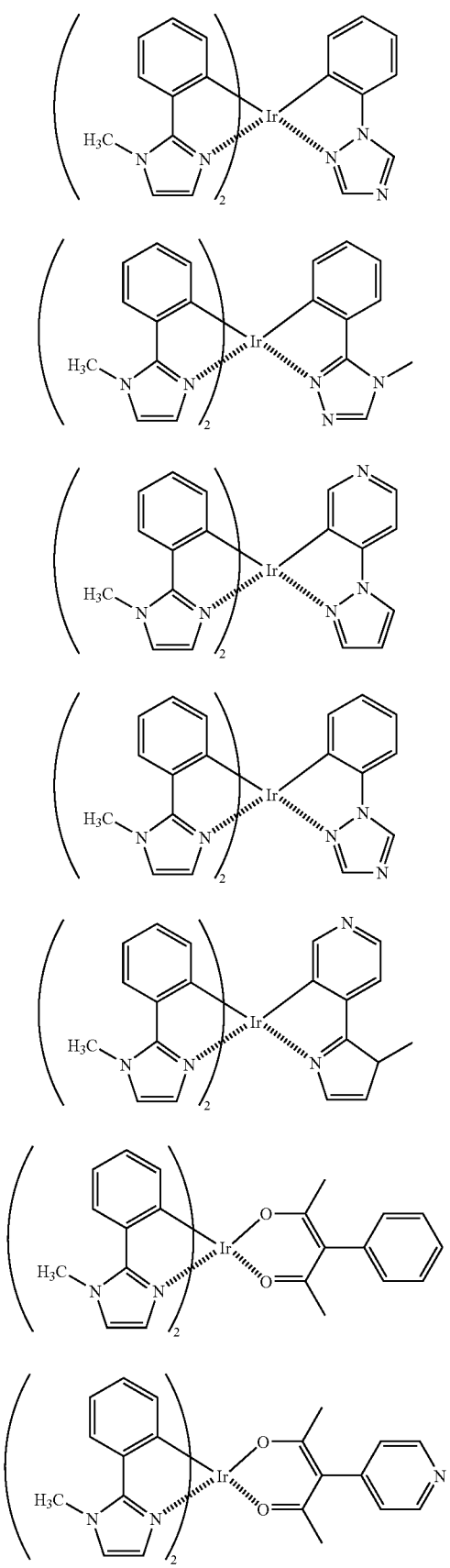
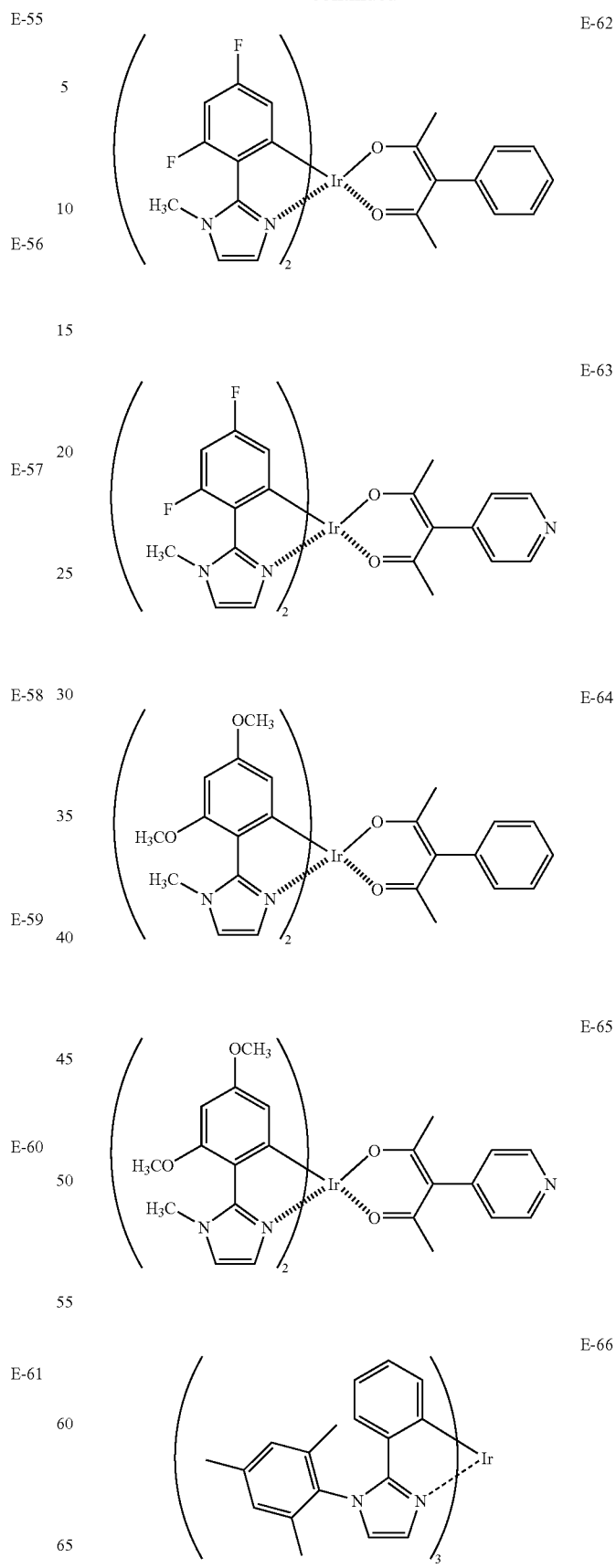

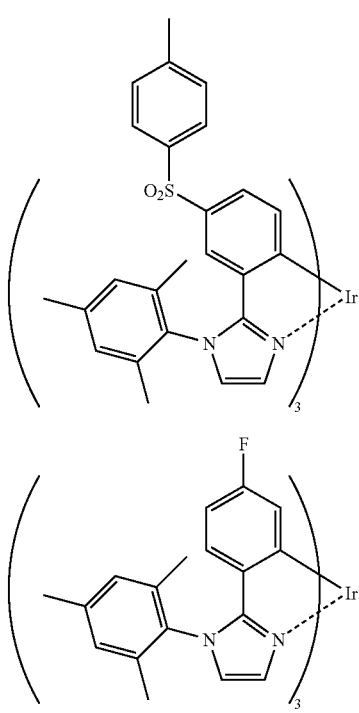

E-67

E-68

Moreover, in the present invention, the ionization potential energy of the afore-mentioned phosphorescence emitting dopant is preferably higher than 5.1 eV (energy being small) in order to obtain a high electric power efficiency.

In the present invention, an additional phosphorescence emitting dopant can be suitably selected from the known compounds used in a light emitting layer of an organic EL element other than a phosphorescence emitting dopant having a partial structure represented by any one of the aforesaid Formulas (A) to (C).

<<Interlayer>>

In the white organic EL element of the present invention, a non-light emitting interlayer (hereinafter also referred to as a non-dope region) may be provided between the light emitting layers.

The thickness of the non-light emitting interlayer is preferably in the range of 1-50 nm, but is more preferably in the range of 3-10 nm to retard the mutual interaction, such as an energy transfer, between the adjacent light emitting layers and to result in no high load to electric current and voltage characteristics of organic EL elements.

Materials employed in the above non-light emitting interlayer may be the same as the host compounds of the light emitting layer or differ. However, it is preferable that they are the same as the host materials of at least one of two adjacent light emitting layers.

The non-light emitting interlayer may incorporate compounds which are common to those (for example, host compounds) of each of the non-light emitting layers. By incorporating each of the common compounds (as used herein, "employing common host materials" refers to the case in which physicochemical characteristics such as phosphorescence emitting energy or the glass transition point are the same, or the case in which the molecular structure of the host compound is the same), the injection barrier between the light emitting layer and the non-light emitting layer is lowered, whereby it is possible to realize targeted effects in which even though the electric voltage and current change, it is easy to maintain a balance of positive hole and electron injection. Further, by employing, in the non-dope light emitting layer, host compounds which exhibit the same physical characteristics or have the same molecular structure as those of the host compounds incorporated in each of the light emitting layers, it is also possible to overcome major drawbacks during preparation of conventional organic EL elements such as troublesome element preparation.

Still further, in order to optimally regulate the positive hole and electron injection balance, also listed is a preferred embodiment in which the non-light emitting interlayer functions as the blocking layer described below, namely as a positive hole blocking layer and an electron blocking layer.

<Injection Layer: Electron Injection Layer, Positive Hole Injection Layer>

An injection layer is appropriately provided and includes an electron injection layer and a positive hole injection layer, which may be arranged between an anode and an emitting layer or a positive transfer layer, and between a cathode and an emitting layer or an electron transport layer.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S. Corp.)", and includes a positive hole injection layer (an anode buffer layer) and an electron injection layer (a cathode buffer layer).

An anode buffer layer (a positive hole injection layer) is also detailed in such as JP-A Nos. 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene. The materials which are disclosed in JP-A No. 2003-519432 are preferably used.

A cathode buffer layer (an electron injection layer) is also detailed in such as JP-A Nos. 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide.

The above-described buffer layer (injection layer) is preferably a very thin layer, and the layer thickness is preferably in a range of 0.1 nm-5 µm although it depends on a raw material.

<Inhibition Layer: Positive Hole Inhibition Layer, Electron Inhibition Layer>

An inhibition layer is appropriately provided in addition to the basic constitution layers composed of organic thin layers as described above. Examples are described in such as JP-A Nos. 11-204258 and 11-204359 and p. 237 of "Organic EL Elements and Industrialization Front Thereof (Nov. 30, 1998, published by N. T. S Corp.)" is applicable to a positive hole inhibition (hole block) layer according to the present invention.

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron.

Further, a constitution of an electron transport layer described later can be appropriately utilized as a positive hole inhibition layer according to the present invention.

The positive hole inhibition layer of the white organic EL element of the present invention is preferably arranged adjacent to the light emitting layer.

On the other hand, the electron inhibition layer, as described herein, has a function of the positive hole transport layer in a broad sense, and is composed of materials having markedly small capability of electron transport, while having capability of transporting positive holes and enables to enhance the recombination probability of electrons and positive holes by inhibiting electrons, while transporting electrons.

Further, it is possible to employ the constitution of the positive hole transport layer, described below, as an electron inhibition layer when needed. The thickness of the positive hole inhibition layer and the electron transport layer according to the present invention is preferably about 100 nm, but is more preferably 5 nm-30 nm.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-trip-tolyl)amine; 4-(di-p-tolylamino)-4'-[4-(di-p-tri-amino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A No. 4-308688.

Polymer materials, in which these materials are introduced in a polymer chain or constitute the main chain of polymer, can be also utilized. Further, an inorganic compound such as a p type-Si and a p type-SiC can be utilized as a positive hole injection material and a positive hole transport material Further, it is possible to employ so-called p type positive hole transport materials, as described in JP-A Nos. 4-297076, 2000-196140, 2001-102175, J. Appl. Phys., 95, 5773 (2004), JP-A No. 11-251067, and J. Huang et al. reference (Applied Physics Letters 80 (2002), p. 139), JP-A No. 2003-519432. In the present invention, since high efficiency light emitting elements are prepared, it is preferable to employ these materials.

This positive hole transport layer can be prepared by forming a thin layer made of the above-described positive hole transport material according to a method well known in the art such as a vacuum evaporation method, a spin coating method, a cast method, an inkjet method and a LB method.

The layer thickness of a positive hole transport layer is not specifically limited, however, it is generally 5 nm-5 μm, and preferably 5 nm-200 nm. This positive transport layer may have a single layer structure comprised of one or not less than two types of the above described materials.

<Electron Transport Layer>

An electron transport layer is comprised of a material having a function to transfer an electron, and an electron injection layer and a positive hole inhibition layer are included in an electron transport layer in a broad meaning. A single layer or plural layers of an electron transport layer may be provided.

Heretofore, when an electron transport layer is composed of single layer and a plurality of layers, electron transport materials (also functioning as a positive hole inhibition material) employed in the electron transport layer adjacent to the cathode side with respect to the light emitting layer, electrons ejected from the cathode may be transported to the light emitting layer. As such materials, any of the conventional compounds may be selected and employed. Examples of these compounds include such as a nitro-substituted fluorene derivative, a diphenylquinone derivative, a thiopyradineoxide derivative, carbodiimide, a fluorenylidenemethane derivative, anthraquinonedimethane, an anthraquinone derivative, an anthrone derivative and an oxadiazole derivative.

Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transport material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transport material.

Further, metal-free or metal phthalocyanine, or those the terminal of which is substituted by an alkyl group and a sulfonic acid group, can be preferably utilized as an electron transport material. Further, distyrylpyrazine derivative, which has been exemplified as a material of an emitting layer, can be also utilized as an electron transport material, and, similarly to the case of a positive hole injection layer and a positive hole transfer layer, an inorganic semiconductor such as an n-type-Si and an n-type-SiC can be also utilized as an electron transport material.

This electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, it is generally 5 nm-5 µm, and preferably 5 nm-200 nm. This electron transport layer may have a single layer structure comprised of one or not less than two types of the above described materials.

Further, it is possible to employ an electron transport layer doped with impurities, which exhibits high n property. Examples thereof include those, described in JP-A Nos. 4-297076, 10-270172, 2000-196140, 2001-102175, as well as J. Appl. Phys., 95, 5773 (2004).

The present invention is preferable since by employing an electron transport layer of such a high n property electron transport layer, it is possible to prepare an element of further lowered electric power consumption.

<Substrate>

A substrate (it may be called as a support) which is applied to a white organic EL element of the present invention is not specifically limited with respect to types of such as glass and plastics. They may be transparent or opaque. However, a transparent substrate is preferable when the emitting light is taken from the side of substrate. Substrates preferably utilized includes such as glass, quartz and transparent resin film. A specifically preferable substrate is resin film capable of providing an organic EL element with a flexible property.

Resin film includes such as: polyesters such as polyethylene terephthalate (PET) and polyethylene naphthalate (PEN); polyethylene, polypropyrene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyimide, fluororesin, Nylon, polymethylmethacrylate, acrylic resin, polyacrylate; and cycloolefine resins such as ARTON (produced by JSR Co. Ltd.) and APEL (produce by Mitsui Chemicals, Inc.)

On the surface of a resin film, it may be formed a film incorporating inorganic and organic compounds or a hybrid film of both. The films are preferably barrier films having a water vapor permeability of at most 0.01 g/m$^2$/day determined based on JIS K 7129-1992. Further preferred films are high barrier films having an oxygen permeability of at most 1×10$^{-3}$ ml/m$^2$/day, and a water vapor permeability of at most 10$^{-5}$ g/m$^2$/day, determined based on JIS K 7126-1992.

As materials forming a barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel, films, opaque resin substrates, and ceramic substrates.

<<Sealing>>

As sealing means employed in a white organic EL element of the present invention, listed may be, for example, a method in which sealing members, electrodes, and a supporting substrate are subjected to adhesion via adhesives.

The sealing members may be arranged to cover the display region of a white organic EL element, and may be an engraved plate or a flat plate. Neither transparency nor electrical insulation is limited.

Specifically listed are glass plates, polymer plate-films, metal plates, and films. Specifically, it is possible to list, as glass plates, soda-lime glass, barium-strontium containing glass, lead glass, aluminosilicate glass, borosilicate glass, bariumborosilicate glass, and quartz. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible make the organic EL element thin, a metal film can be preferably employed. Further, the oxygen permeability of the polymer film is preferably at most 10$^{-3}$ g/m$^2$/day, while its water vapor permeability is at most 10$^{-3}$ g/m$^2$/day. It is more preferable that both the oxygen permeability and the water vapor permeability are at most 10$^{-5}$ g/m$^2$/day.

Conversion of the sealing member into concave is carried out employing a sand blast process or a chemical etching process. In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed may be hot-melt type polyamides, polyesters, and polyolefins. Yet further listed may be cationically curable type ultraviolet radiation curable type epoxy resin adhesives.

In addition, since an organic EL element is occasionally deteriorated via a thermal process, those are preferred which enable adhesion and curing between room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials forming the aforesaid film may be those which exhibit functions to retard penetration of those such as moisture or oxygen which results in deterioration. For example, it is possible to employ silicon oxide, silicon dioxide, and silicon nitride. Still further, in order to improve brittleness of the aforesaid film, it is preferable that a laminated layer structure is formed, which is composed of these inorganic layers and layers composed of organic materials.

Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

In a gas phase and a liquid phase, it is preferable to inject inert gases such as nitrogen or argon, and inactive liquids such as fluorinated hydrocarbon or silicone oil into the space between the sealing member and the surface region of the organic EL element. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

<<Protective Film and Protective Plate>>

The aforesaid sealing film on the side which nips the organic layer and faces the support substrate or on the outside of the aforesaid sealing film, a protective or a protective plate may be arranged to enhance the mechanical strength of the element. Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and a decrease in thickness, it is preferable to employ polymer films.

<Anode>

As an anode according to an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized.

As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. Alternatively, when coatable materials such as organic electrically conductive compounds are employed, it is possible to employ a wet system filming method such as a printing system or a coating system.

When emission is taken out of this anode, the transmittance is preferably set to not less than 10% and the sheet resistance as an anode is preferably not more than a few hundreds $\Omega/\square$. Further, although the layer thickness depends on a material, it is generally selected in a range of 10 nm-1,000 nm and preferably of 10 nm-200 nm.

<Cathode>

On the other hand, as a cathode according to the present invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum.

As for a cathode, these electrode substances may be made into a thin layer by a method such as evaporation or spattering. Further, the sheet resistance as a cathode is preferably not more than a few hundreds $\Omega/\square$ and the layer thickness is generally selected in a range of 10 nm-5 μm and preferably of 50 nm-200 nm. Herein, to transmit emission, either one of an anode or a cathode of an organic EL element is preferably transparent or translucent to improve the mission luminance.

Further, after forming, on the cathode, the above metals at a film thickness of 1 nm-20 nm, it is possible to prepare a transparent or translucent cathode in such a manner that electrically conductive transparent materials are prepared thereon. By applying the above, it is possible to produce an element in which both anode and cathode are transparent.

<<Preparation Method of Organic EL Element>>

As one example of the preparation method of a white organic EL element of the present invention, the preparation method of the organic EL element composed of anode/positive hole injection layer/positive hole transport layer/light emitting layer/electron transport layer/electron injection layer/cathode will be described.

Initially, a thin film composed of desired electrode substances, for example, anode substances is formed on an appropriate base material to reach a thickness of at most 1 μm but preferably 10 nm-200 nm, employing a method such as vapor deposition or sputtering, whereby an anode is prepared.

Subsequently, on the above, formed are organic compound thin layers including a positive hole injection layer, a positive hole transport layer, a light emitting layer, a positive hole inhibition layer, an electron transport layer, and an electron injection layer, which are organic EL element materials.

The light emitting layers according to the present invention have a structure containing at least a light emitting layer A and a light emitting layer B. The light emitting layer A contains a phosphorescence emitting dopant exhibiting a maximum emission wavelength of 480 nm or less. The light emitting layer B is provide between the light emitting layer A and the anode, and the light emitting layer B exhibits a maximum emission wavelength of 510 nm or more.

In the present invention, the thickness of the light emitting layer A is preferably larger than the thickness of the light emitting layer B. Further, it is preferable that the thickness of the light emitting layer B is 10 nm or less in order to obtain higher electric power efficiency. However, it was revealed that this range of thickness has a tendency to deteriorate the chromaticity stability after a prolonged driving time. The reason of this chromaticity stability is attributed to the shift of the light emitting position in the light emitting layer during a driving time. It is supposed that when the thickness of the light emitting layer B becomes smaller, the effect caused by the shift of the light emitting position tends to be larger.

Methods to form each of these layers include, as described above, a vapor deposition method and a wet process (such as a spin coating method, a cast method, an ink-jet method and a printing method). In view of easy formation of a homogeneous film and rare formation of pin holes, preferred coating methods are a vapor deposition method, a spin coating method, an ink-jet method and a printing method. Different coating methods may be applied for different layers.

When a vapor deposition method is adopted for making a layer, the condition of a vapor deposition varies depending on the compounds employed. It is generally preferable to select the conditions of: heating temperature of a boat, 50° C. to 450° C.; vacuum degree, $10^{-6}$ Pa to $10^{-2}$ Pa; deposition rate, 0.01 nm/sec to 50 nm/sec; temperature of a substrate, −50° C. to 300° C.; and layer thickness, 0.1 nm to 5 μm, more preferably to select the thickness of from 5 nm to 200 nm.

After forming these layers, a thin layer composed of cathode materials is formed on the above layers via a method such as vapor deposition or sputtering so that the film thickness reaches at most 1 μm, but is preferably in the range of 50 nm-200 nm, whereby a cathode is arranged, and the desired organic EL element is prepared.

When an organic EL element of the present invention is prepared, it is preferred to make all of the layers from a cathode layer to a positive hole injection layers without interruption and with one time evacuation. However, it may be possible to take out the intermediate product and may apply it a different layer making process. For that purpose, it is required to carry out the operation under a dry inert gas atmosphere.

Further, by reversing the preparation order, it is possible to achieve preparation in order of a cathode, an electron injection layer, an electron transport layer, a light emitting layer, a positive hole transport layer, a positive hole injection layer, and an anode. When direct current voltage is applied to the multicolor display device prepared as above, the anode is employed as + polarity, while the cathode is employed as − polarity. When 2 V-40 V is applied, it is possible to observe light emission. Further, alternating current voltage may be applied. The wave form of applied alternating current voltage is not specified.

It is generally known that an organic EL element emits light in the interior of the layer exhibiting the refractive index (being about 1.6-about 2.1) which is greater than that of air, whereby only about 15%-about 20% of light generated in the light emitting layer is extracted.

This is due to the fact that light incident to an interface (being an interface of a transparent substrate to air) at an angle of θ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example, a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. 63-314795), a method in which a reflection surface is formed on the side of the element (JP-A No. 1-220394), a method in which a flat layer of a middle refractive index is introduced between the substrate and the light emitting body and an antireflection film is formed (JP-A No. 62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. 11-283751).

In the present invention, it is possible to employ these methods while combined with the white organic EL element of the present invention. Of these, it is possible to appropriately employ the method in which a flat layer of a refractive index which is equal to or less than the substrate is introduced between the substrate and the light emitting body and the method in which a diffraction grating is formed between the substrate and any of the layers such as the transparent electrode layer or the light emitting layer (including between the substrate and the outside).

By combining these means, the present invention enables the production of elements which exhibit higher luminance or excel in durability.

When a low refractive index medium of a thickness, which is greater than the wavelength of light, is formed between the transparent electrode and the transparent substrate, the extraction efficiency of light emitted from the transparent electrode to the exterior increases as the refractive index of the medium decreases.

As materials of the low refractive index layer, listed are, for example, aerogel, porous silica, magnesium fluoride, and fluorine based polymers. Since the refractive index of the transparent substrate is commonly about 1.5-about 1.7, the refractive index of the low refractive index layer is preferably at most approximately 1.5, but is more preferably at most 1.35.

Further, thickness of the low refractive index medium is preferably at least two times the wavelength in the medium. The reason is that when the thickness of the low refractive index medium reaches nearly the wavelength of light so that electromagnetic waves oozed via evernescent enter into the substrate, effects of the low refractive index layer are lowered.

The method in which the interface which results in total reflection or a diffraction grating is introduced in any of the media is characterized in that light extraction efficiency is significantly enhanced.

The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced.

However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is desirous.

In this case, the cycle of the diffraction grating is preferably about ½-about 3 times the wavelength of light in the medium. The preferable arrangement of the diffraction grating is such that the arrangement is two-dimensionally repeated in the form of a square lattice, a triangular lattice, or a honeycomb lattice.

Via a process to arrange a structure such as a micro-lens array shape on the light extraction side of the white organic EL element of the present invention or via combination with a so-called light collection sheet, light is collected in the specific direction such as the front direction with respect to the light emitting element surface, whereby it is possible to enhance luminance in the specific direction.

In an example of the micro-lens array, square pyramids to realize a side length of 30 µm and an apex angle of 90 degrees are two-dimensionally arranged on the light extraction side of the substrate. The side length is preferably 10 µm-100 µm. When it is less than the lower limit, coloration occurs due to generation of diffraction effects, while when it exceeds the upper limit, the thickness increases undesirably.

It is possible to employ, as a light collection sheet, for example, one which is put into practical use in the LED backlight of liquid crystal display devices. It is possible to employ, as such a sheet, for example, the luminance enhancing film (BEF), produced by Sumitomo 3M Limited. As shapes of a prism sheet employed may be, for example, Δ shaped stripes of an apex angle of 90 degrees and a pitch of 50 µm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

<<Display Device>>

The display device employing a white organic EL element of the present invention will be described.

The white organic EL element of the present invention is employed in a multicolor or white display device. In the case of the multicolor or white display device, a shadow mask is provided only during formation of the light emitting layer, and it is possible to form film on one side, employing a vapor deposition method, a casting method, a spin coating method, an ink-jet method, or a printing method. When only the light emitting layer is subjected to patterning, its methods are not particularly limited, but the preferred methods include the vapor deposition method, the ink-jet method, and the printing method. When the vapor deposition method is employed, a patterning shadow mask is preferred.

Further, by reversing the preparation order, it is possible to carry out the preparation in the order of a cathode, an electron transporting layer, a positive hole blocking layer, a light emitting layer unit (which is composed of at least three layers of the above light emitting layers A, B, and C and may be composed of a non-light emitting interlayer between each of the light emitting layers), a positive hole transporting layer, and an anode. When direct current voltage is applied to the multicolor or white display device prepared as above, application of voltage of about 2-about 40 V, while the anode is at positive polarity and the cathode is at negative polarity, results in observable light emission.

Further, when voltage is applied at reversed polarity, no electric current flows to result in no light emission. Still further, when alternating current voltage is applied, light emission results only when the anode is in the negative state, while the cathode is in the positive state. The waveform of applied alternating current is not particularly limited.

<<Lighting Device>>

A lighting device, to which the white organic EL element of the present invention is applied, will now be described.

The white organic EL element of the present invention may be employed as a type of lamps for lighting or an exposure light source. Further, it may be employed as a display for the type in which still images as well as moving images are directly visible. A driving system, when employed as a display device for reproducing moving images, may be either a simple matrix (a passive matrix) system or an active matrix system.

The white organic electroluminescent element employed in the present invention, if desired, may be subjected to patterning during film making, employing a metal mask or an ink-jet printing method. The electrode and the light emitting layer may be subjected patterning, or all element layers may be subjected to patterning. Light emitting dopants employed in the light emitting layer are not, particularly limited. For example, in the case of a backlight in a liquid crystal display element, whiteness will be realized by combining any of those selected from platinum complexes or light emitting dopants known in the art to be suitable for the wavelength region corresponding to CF (color filter) characteristics, or combining light bringing-out and/or light focusing sheets according to the present invention.

The white organic EL element of the present invention is preferred due to the following reasons. It is thereby possible to prepare a full-color organic electroluminescent display of longer operating time at lower driving voltage by obtaining blue light, green light, and red light via a blue filter, a green filter, and a red filter, respectively, employing, as a backlight, white light emitted from the organic electroluminescent element as described in claim 7, by arranging the element and the driving transistor circuit by combining it with a CF (color filter) or matching it to a CF (color filter) pattern.

<<Industrial Fields to which the White Organic EL Element of the Present Invention is Applicable>>

It is possible to employ the white organic EL element of the present invention as display devices, displays, and various light emitting sources. Examples of light emitting sources include home lighting, lighting in vehicles, backlights for clocks and liquid crystals, advertising boards, traffic lights, light sources for optical memory media, light sources for electrophotographic copiers, light sources for optical communication processors, and light sources for optical sensors, but are not limited thereto. Specifically, it is possible to effectively employ it as a backlight for various display devices combined with a color filter, a light diffusing plate, or a light bringing-out film, and light sources for lighting.

By utilizing the characteristics of the white organic EL element of the present invention, it may be applied to the various lighting appliances and display devices listed below.

(Product Exhibitions and Displays)

Product exhibition and displays include product displays at shops, frozen and refrigerated items show cases, lighting of installation in museums, art museums, and exhibition halls, automatic dispensers, game machines, and transit advertisements.

Product displays in shops include decorative displays of the shop itself, show cases, POP, and signs. In shops such as up-scale brand shops, noble metal shops, fashion based shops, or high-class restaurants, which place importance on their brand images, effects of the shop image resulting from lighting are significantly great. Thus, in these fields, lighting is selected with much care.

In indirect lighting fields in which atmosphere is created by making an ingenious architectural structure so that light sources are not directly visible, it is possible to list the enhancement of construction efficiency in such a manner that it is possible to eliminate the space for light sources and their instruments, whereby no complicated structure is needed, and it is also possible to eliminate the space between the light source and a diffusing plate, which are required so that no shape of light sources can be seen through the plate.

Further, as a tool for changing the shop's image, no space is needed by fitting as a display shelf, a floor, and a store fixture, and by utilizing the characteristic of the light-weight light source, there are the advantages such a large degree of design freedom, higher construction efficiency, and possibility of easy acceptance.

Frozen and refrigerated items show cases are placed in supermarkets and convenience stores. In order that fresh products such as vegetables, fruit, fresh fish and dressed meat are easily viewed as items of full of "beauty" and "freshness", and are easily picked up, lighting equipment is one of the important parts.

By employing organic EL light sources, adverse effects to the cooling function are low due to light emission at a relatively low temperature, and it is possible to increase storage space due to significant reduction of space for the light source due to its thin structure. Consequently, it is possible for customers to easily choose food items placed in a case of smart design and to easily pick them up. Further, it is possible to attract customers by employing colored light which enables easier evaluation as good food quality, resulting in a contribution for increased sales.

With regard to lighting in museums, art museums, and exhibition halls, in view of visibility and light damage to exhibits, it is necessary to select suitable light sources. Anti-fading fluorescent lamps of a low ratio of ultraviolet rays are developed.

The organic EL light sources result in no adverse effects to articles on exhibition due to no ultraviolet rays and a relatively low heat emission, and further, there is no glare since the light source surface emits light uniformly, whereby it is possible to faithfully appreciate exhibits as their are, based on high color rendering properties of the light sources. Further, since no large light source equipment is required, no extra bulge of the equipment is entered into the sight whereby only exhibits receive attention. Further, in a large scale exhibition hall such as a show, it is possible to easily construct a large scale decoration fitted with lights, which receive attention, due to the features such as light weight and thin structure.

In automatic dispensers, light sources are employed in sections such as push buttons, sample products, and posters on the front surface of the dispenser.

With regard to automatic dispensers, competition is occurring for additional functions to be brought in and space for placing them. Consequently, automatic dispensers are in the field where advantages of organic EL such as no requirement of space for a large light source due to a low thickness are realizable. Specifically, its application to the poster space above the coin slot is highly needed. Further, in recent years, more machines are seen which have gaming functions such as winning or losing with each sale. Thus, it is possible to further utilize the advantages by loading a light source (being a moving image display) which functions to control pixels in the poster section on the front surface.

Machines for amusement include common pinball machines and pinball machines fitted with a slot machine mechanism. For these machines for amusement, it is critical that players enjoy games while realizing excitement of amusement properties (gaming and gambling). By reducing the thickness of light sources, an advantage is realized in which it is possible to reduce the thickness of the machine. In addition, in the Same manner as for automatic dispensers, a further advantage is realized by loading a light source which functions pixel control (a moving image display).

Mass transit advertisements include posters and advertising displays in public areas, posters and screens in trains and buses, and advertisements affixed to vehicle bodies. Specifically, some of these posters and advertising displays are in the form of a box, in which fluorescent lamps are employed as a backlight. In such a case, by replacing the lamps with an organic EL, it is possible to reduce the thickness and weight of the box.

Further, with regard to suspended advertising displays, by reducing the thickness of the box, it is possible to reduce of accumulation of dust and dirt, and further to overcome problems such as bird droppings.

(Built-in Lighting for Interior, Furniture, and Building Materials)

In the construction fields, those in which lighting is integrated with a floor, a wall, and a ceiling are called "architectural lighting". Representative "architectural lighting" include, according to its system, cornice lighting, troffer lighting, cove lighting, a luminous ceiling, and a louver ceiling. For these, it is desired that building elements themselves emit light so that lighting light sources are built in the ceilings, walls and floors to eliminate the existence or atmosphere as lighting.

Lighting sources employing organic EL elements are most suitable for "architectural lighting" in terms of their low thickness, light weight, color controlling, and design changeability, and are applicable even to interiors, furniture and fixtures. Via the development of organic EL light sources, it is possible to spread, to common dwelling houses, the above architectural lighting which has been employed only in shops or art museums, whereby it is possible to discover new demands.

In commercial facilities, by employing the organic EL light sources in semi-basement shops and ceilings of arcades, and by being able to easily change the brightness and color temperature of lighting, it is possible to create an optimal commercial space which is not affected by weather, or time of a day.

Examples of interiors, fixtures, and furniture include a desk, a chair, or a cupboard, a shoe box, or a locker for storage, a bathroom vanity, a Buddhist altar or a sanctuary, a bed light, a foot light, a banister, a door, a paper panel, or a sliding screen which are not limited thereto.

On the other hand, it is possible to change transparency/opacity via extinction/light emitting by applying a transparent electrode to the EL light source. Thus, it is also possible to apply the resulting light source to any of the windows, doors, curtains, window shades, and partitions.

(Lighting for Automobiles and Light Emitting Displays)

For automobiles, it is possible to apply the organic EL element to lighting instruments and light emitting displays on the exterior of automobiles, as well as the interior. The former includes (minor classification) head lamps, auxiliary lamps, front position lights, fog lamps, and turn signals in the front position, and stop lamps, back position lamps, turn signals and number plate lamps as a rear combination lamp in the back position.

Specifically, a sheet of the rear combination lamp is formed employing the organic EL element, and by allowing the resulting sheet to adhere to the back position, the room for lamps in the back position is reduced, whereby it is possible to increase the trunk room. Further, when visibility is poor due to rain and fog, it is possible to enhance visibility by increasing the area of front position lights and the stop lamps. On the other hand, by allowing wheels to emit light employing the organic EL element, it is possible to enhance visibility from the sides. Further, by forming a whole body employing the organic EL elements, it is possible to include new ideas to body color and design.

The latter includes, as the lighting instruments and light emitting displays in the interior of automobiles, room lights, map lights, footboard lamps in the lower part of the door, meter displays, car navigation displays, and hazard lights. Specifically, by utilizing the transparency of the organic EL element, it may be employed as a sun roof during day time, while it may be employed as a mild room light of a surface light source via light emission during night. Further, in taxies, by allowing a lighting instrument composed of the organic EL element to adhere to the back side of front seats, it is possible to construct a hand lighting system which is easily usable for customers without hindering driver's driving and sacrificing space in the room.

(Public Transportation Facilities)

It is possible to take advantage of the characteristics of the organic EL element of the present invention in lighting and displays in the interior of public transportation means such as electric trains, subway cars, buses, aircraft, and ships.

Many lighting devices are installed in aircraft. Of passenger cabin lighting, cargo room lighting, and pilot cabin lighting, advantages of the organic EL lighting are fully realized for indirect lighting in the passenger cabin.

Fluorescent lamps and incandescent bulbs are employed for lighting in the passenger cabin. These are employed in such a manner that on the ceiling, indirect lighting reflected by the side is available. The above lighting is designed so that relaxing atmosphere is created and pieces of broken glass will not fall to the passenger cabin by any possibility of troubles.

By employing these organic EL light sources, it becomes easier to realize indirect lighting. Further, when employed as direct lighting, no danger occurs in which broken pieces are scattered, and it enables creation of relaxing atmosphere under diffused light.

Further, it is critical for aircraft to reduce consumption of electric power and the body weight. Consequently preferred are organic EL light sources which consume less power and exhibit less weight. The above advantages are realized not only for aircraft passenger lighting but also for airport terminal lighting in baggage claim areas, resulting in a decrease in leftover baggage.

In facilities such as railroad stations, bus stops, and airports belonging to public transportation facilities, displays and lighting for passenger leading are employed. Further, at night, at outdoor bus stops, when bus waiting persons are detected, lighting is increased, whereby it is possible to contribute to crime prevention.

(Light Sources for OA Equipment)

Light sources for OA equipment are employed in facsimile machines, copiers, scanners, printers and composite machines thereof in which reading sensors are mounted.

Reading sensors are divided into a contact type sensor (CIS) which is combined with an equal magnification optical system, and a condensed type sensor (CCD linear) which is combined with a condensed optical system.

With regard to CIS, the definition differs depending on its maker. There is a case in which one which is subjected to a module of a sensor rod lens array LED board is called CISM (contact image sensor module), while there is a case in which a sensor chip incorporated in the module is called CIS. In these light sources, employed are LEDs, xenon, CCFL lamps, and LDs.

OA equipment is continually demanded to be smaller and to be driven at lower voltage. Characteristics of the organic EL which is extremely thin and is drivable at low heat generation and low voltage are capable of meeting these demands.

(Industrial Testing System)

In manufacturing companies, a large number of man-hours and manpower is spent in visual inspection processes. However, the above processes have been automated to detect missing parts utilizing captured images. The image of an object, captured by a CCD camera, is transformed to digital signals, and characteristics of the object, such as area, length, quantity, and position are extracted via arithmetic processing, whereby determination results are outputted. In order to capture the above images, light sources are necessary. The above testing system is employed for a package and shape size test, and a micro-part test.

Lighting sources employed for image sensors include fluorescent lamps, LEDs, and halogen lamps. Of these, as a backlight which illuminates a transparent vessel and a lead frame from the background, required is light which is uniform in a plane shape.

Further, in order to detect the stain of sheet, light is required which is linearly uniform and is capable of illuminating the front surface in the lateral direction. As noted above, requirements for light sources vary depending on the item to be tested.

By employing the organic EL light sources in this field, for example, in a bottling process, lighting is arranged 360° around a bottle, and it is possible to achieve full image capture via a single lighting, whereby it is possible to achieve inspection within a shorter time. Further, it is possible to significantly reduce the space occupied by a light source within the interior of testing instrument. Further, since it is a surface light source, it is possible to avoid inspection errors due to difficulty of measurement of captured images via light reflection.

(Light Sources for Growing Agricultural Products)

The term, "plant factory" refers to "a year-round production system of plants utilizing high technology such as environmental control and automation". Technology is employed which automatically produces plants without dependence on weather and without manpower by controlling the plant-growing environment via computer.

When world population growth and environmental problems in the future are considered, it is necessary to achieve so-called agriculture industrialization leading to stable food production via introduction of higher technology in agriculture. Recently, the possibility of application of LEDs and LDs as a plant growing light source has been enhanced. Light sources such as high pressure sodium lamps, which have frequently been employed, result in a poor spectral balance of red to blue light. Further, its large amount of generated heat increases an air condition loads and makes it necessary to take a sufficient distance from plants, resulting in a problem of an increase in the size of facilities.

The thickness of organic EL light sources is minimal so that many shelves are arranged, and the heat release value is low, whereby higher efficiency is achieved by placing them nearer the plants. Thus, it is possible to increase the cultivated amount.

Further, by utilizing the advantage of better space saving, in typical homes, it is possible to keep a vegetable garden in small kitchens. The concept that vegetable gardens are possible only outdoors such a garden, a porch or a rooftop is altered so that it becomes possible for many people to enjoy vegetable gardens.

(Escape Lighting)

Disaster prevention lighting equipment, specified by the Fire Defense Law, and the Building Standard Law, includes guiding lamps which show exits and escape routes during fires of buildings, and emergency lamps to assure brightness of escape routes for quicker escape.

Signals, guide lamps and emergency lamps, which are employed for FA and public use, are premised to be easily seen. Consequently, an excessive increase in their size results in unbalance against buildings depending on their arranged positions. Such unbalance has often been pointed out by architects and designers. To overcome the above, taken are countermeasures such as the use of pictographs which are understood at a glance, and enhanced eye catching effects employing light sources. Heretofore, fluorescent lamps have often been employed as the light source of such guide lamps, but recently, guide lamps employing LEDs have appeared.

Applying organic EL light sources to the above guide lamps enables no decrease in luminance due to its uniformity and angle characteristics and enhancing visibility, enables easier installation without special engineering works due to their low electric power and low thickness, and eliminates replacement compared to the type which employs fluorescent lamps, and enables easier maintenance. Further, color fading of the light emitting surface is less due to minimal heat generation. Accordingly, it is possible to enhance safety via installation in many places such as floors, stairs, or banisters of escape routes, or fire doors. Further, no current mercury problems occur which are concerned for fluorescent lamps, and they are hardly broken exhibiting excellent safety. Further, it may be stated that they are light sources which enable enhanced eye catching effects without spoiling beauty due to the space saving and thin type design.

(Lighting for Imaging)

Light sources, employed in photo studios and identification picture booths, include halogen lamps, tungsten lamps, strobe lights, and fluorescent lamps. Each photo is made using two types of light, such as one in which light from the above light sources is directly and linearly incident to the subject to result in strong shades, or the other in which mild light which results in much less shades is made, are combined in various angles. Light is diffused via a method in which a diffuser is sandwiched by the light source and the subject, or in which reflected light being incident to another surface to reflector) is employed.

The organic EL light source emits diffused light, whereby it is able to emit light corresponding to the former without using a diffuser. In such a case, advantages are realized in that a space between the light source and the diffuser, which is needed for the conventional light sources, becomes unnecessary and it is possible to control detailed shading, which is conducted by delicate angle adjustment of light employing a reflector, or by bending a flexible type organic EL itself.

Color rendering is occasionally required for light sources employed for imaging. When color appears very different from that when viewed under sun light, color rendering is evaluated to be poor, while when the difference is small, color rendering is evaluated to be good. It is hardly stated that fluorescent lamps, employed in typical homes, are preferable for imaging due to their wavelength characteristics and lighted portions tend to be greenish.

In many cases, it is required that skin, make-up, hair, kimono, and jewelry are imaged to result in faithful color. The color rendering is one of the critical factors for light. The organic EL light sources exhibit excellent color rendering and are preferable for imaging in which faithful colors are demanded. The above advantage is also utilized in the place where faithful evaluation of colors related to printing and dying are intended.

By arranging surface light sources such as the organic EL light source on an entire ceiling, during image capturing of children and pets, it is possible to capture relaxed and natural expression, since without inhibition of movement, children and pets can be allowed to play freely in the room.

(Electric Home Appliances)

In many cases, light sources are incorporated in electric home appliances for ease for viewing details, ease for work, and their designs. For example, microwave ovens, sewing machines, dish washing and drying machines, refrigerators, and AV equipment have been fitted with light sources, but recently, clothes washing and drying machines of a horizontal type have been fitted with internal light sources to reduce cases of forgotten items of clothes within them. In conventional machines, incandescent electric bulbs and LEDs are often installed. Hereinafter, it is possible to consider various applications such that by arranging a lighting unit at the tip of a vacuum cleaner, shaded areas by an article of furniture can be confirmed to be clean, or by arranging, in an electric shaver, a light source emitting a specified wavelength of light, the resulting state of shaving can be monitored.

The above electric home appliances are required to realize a decrease in overall weight and size and further an increase in storage space. The light source portion is required to use space as small as possible while the entire area can be illuminated. The thin organic EL surface light source is able to fully meet the above demands.

(Play Room)

By arranging lighting employing the organic EL under the ice of a skating rink, it is possible to make representation which differs from one employing spot lights above the rink floor. The organic EL is particularly advantageous to this use due to its low light emission temperature. Further, it is possible to emit light synchronized with skaters' motion via detection of the skaters' position. Combination effects of the organic EL with spotlights and light emission in conjunction with music rhythms are effective to make a show more attractive.

In a planetarium, instead of conventional projection from a lower position, it is possible to employ a system in which the dome itself simulates stars by arranging minute pixels of organic EL over the entire dome, whereby it is possible to realize a planetarium without a projector.

(Lighting for Illumination)

Commonly, the term "illumination" in Japan has been referred, in the most cases, to illumination for trees. However, in view of environmental protection, in recent years, cases have increased in which decorations are applied to structures such as houses, gates or hedges, differing from the conventional trees. In those, a main stream is that many point light sources are employed and decorations are achieved in the form of lines, and due to the appearance of LEDs, it is forecast that the above will further increase.

By employing the organic EL lighting in this field, it is possible to further enhance presentation effects due to lighting as follows. Heretofore, representation has been achieved via only connection of point light sources. However, for illuminating the above trees, variation is achieved in which leaf-shaped light sources are attached, an entire tree is illuminated by twisting light sources around the entire tree, and adversely, via connection as a stylized surface module in the same way as a point light source, as a whole, characters and pictures are formed while employing as a cocktail palette which is lighted to various colors, whereby illumination effects may be further enhanced.

(Lighting Fitted with Belongings and Clothing)

Light reflective materials (such as light reflective sheets) are marketed and utilized while being attached to any of the belongings, shoes, or clothes during outdoor walking or exercise at night so that reflection of head lights is readily noticed by bicyclists or car drivers to defend one's security.

In the case of a glass bead type, minute glass beads are mounted on the surface, and incident light is subjected to retroreflection in the light source direction via the function of the above lens. When light from the headlights of a car is directed to the above, light is returned into the eye position of drivers, and the drivers view strong and brilliant light.

In the case of a prism type, the same functions are employed, but the structure of the lens differs. The glass bead type is characterized in that a high reflection effect is realized for light in the oblique direction, while the prism type is characterized in that it more reflects light from the front than the glass bead type, but occasionally results in relatively low reflection effects for light in the oblique direction.

Further, it is possible to select materials and any of the adhesion methods, depending on hardness of place to be adhered. In any of the conventional cases, in order that pedestrians are noticeable, it is essential that light is reflected. In a backward parking place, ingenuity such as adhesion to foot is required so that headlights directed downward are reflected as early as possible.

By employing the organic EL light source as an alternative to reflectors, it is possible to allow drivers to notice pedestrians prior to the range when the headlights are reflected, resulting in more secured safety. Further, for other light sources, it is possible to employ a thin sheet-shaped type, whereby it is possible to realize effects while maintaining an advantage as a seal. These are applied not only to people's clothing but also to pet clothing.

When a low power consuming organic EL is available, it is possible to emit light employing generated electricity while walking. Specifically, it is possible to achieve application to a person specifying clothing, and for example, it is possible to contribute to earlier protection of wanderers. By having a wet suit for diving emit light, it may be possible to identify the position of a diver and the diver may protect oneself from sharks. Needless to say, it is possible to apply EL light sources to entertainers' garments at shows, as well as and wedding dresses.

(Light Sources for Communication)

Further, it is possible to effectively utilize light emitters employing such organic EL elements in a "visible light tag" which sends simple messages and information employing visible light. Namely, by realizing light emission of signals due to blinking lights of an extremely short duration, it is possible to send a large amount of information to persons receiving the same.

Even when the light emitter emits light signals, duration between the signals is very short, whereby human eyes recognize them as continuous lighting. Lighting arranged on roads, and in shops, exhibition halls, hotels, or amusement parks, transmits typical information signals of each of the places so that necessary information can be provided. In the case of an organic EL, a plurality of light emitting dopants which differ in wavelength is incorporated in a single light emitter, and by generating different signals for each of the different wavelengths, a single light emitter is able to provide a plurality of different pieces of information. In such cases, an organic EL, which emits stable wavelengths of light and stable color tone, is advantageous.

Differing from information delivery employing voices, electric waves, and infrared rays, "visible light tags" are simultaneously incorporated as a lighting means, whereby troublesome additional installation is unnecessary.

(Medical Light Sources)

By applying an organic EL to lighting of an endoscope which currently employs halogen lamps are employed, or to lighting for abdominal operation which is achieved by inserting a wire, a decrease in size and weight is achieved, whereby its use will likely expand. The organic EL may be applied to the endoscope capsule (an oral endoscope) employed for internal body inspection and medical treatment which have received increased attention in recent years. Thus, the organic EL is prospective.

(Others)

An emitter into which the organic EL element of the present invention is incorporated enables easy selection of color tone, results in no blinking which is seen in fluorescent lamps, and results in stable color tone under relatively low power consumption. Consequently, it is useful as the insect pest controlling apparatus, described in JP-A No. 2001-269105, the lighting for a mirror, described in JP-A No. 2001-286373, the bath room lighting system, described in JP-A No. 2003-288995, the artificial light source for growing plants, described in JP-A No. 2004-321074, the light emitter of a water pollution measuring apparatus, described in JP-A No. 2004-354232, an adhesion body for a medical treatment employing light-sensitive medicine, described in JP-A No. 2004-358063, and the medical shadowless lamp, described in JP-A No. 2005-322602.

EXAMPLES

The present invention will now specifically be described, however, the present invention is not limited thereto. "Parts" or "%" when employed in the examples represent "parts by weight" or "% by weight", respectively.

Example 1

Preparation of Organic EL Elements

[Preparation of Organic EL Element 1]

A 120 nm thick ITO (indium tin oxide) film was formed as an anode on a 0.7 mm thick 30 mm×30 mm glass substrate. The resulting substrate was subjected to patterning. Thereafter, the transparent substrate, fitted with the above ITO transparent electrode, was subjected to ultrasonic cleaning employing isopropyl alcohol, dried employing nitrogen gas, and subjected to UV ozone cleaning over 5 minutes. Thereafter, the resulting transparent substrate was fixed in the substrate holder in a commercial vacuum deposition apparatus. Each of the materials in an optimal amount constituting each layer was placed in each crucible for deposition in the vacuum deposition apparatus. The employed crucible for deposition was prepared via resistance heating materials such as molybdenum or tungsten.

After subjected to plasma treatment for 2 minutes at an oxygen gas pressure of 1 Pa and an electric power of 100 W (an area of the electrode: about 450 cm$^2$), the substrate was transferred to the organic layer vapor deposition chamber without exposing to the air, and the organic layers were prepared therein.

After reducing pressure to a vacuum degree of 1×10$^{-4}$ Pa, the above crucible for deposition in which m-MTDATA was placed was energized and deposition was conducted onto the transparent substrate at a deposition rate of 0.1 nm/second, whereby a 10 nm positive hole injecting layer was provided. Subsequently, α-NPD was deposited in the same manner as above, whereby a 30 nm positive hole transporting layer was provided.

Subsequently, each light emitting layer was prepared according to the following procedures.

Ir-1, Ir-14 and Compound 1-6 were simultaneously deposited at a deposition rate of 0.1 nm/second so that the concentrations of Ir-1 and Ir-14 each respectively would result in 15% by weight and 2% by weight, whereby an 8 nm thick green-red phosphorescence emitting layer (Light Emitting Layer 1 listed in Table 1) having a maximum emission wavelength of 622 nm was formed.

Subsequently, E-66 and Compound 1-6 were simultaneously deposited at a deposition rate of 0.1 nm/second so that the concentration of E-66 would result in 12% by weight, whereby a 15 nm thick blue phosphorescence emitting layer (Light Emitting Layer 2 listed in Table 1) having a maximum emission wavelength of 471 nm was formed. Here, the concentration of E-66 in Light Emitting Layer 2 was uniform in the thickness direction from the anode to the cathode.

Thereafter, M-1 was deposited to result in a thickness of 5 nm, whereby a positive hole blocking layer was formed. Further, CsF was deposited together with M-1 to result in 10% by weight, whereby a 45 nm thick electron transporting layer was formed.

Then, by depositing aluminum having a thickness of 110 nm to form a cathode, Organic EL Element 1 was thus prepared.

Subsequently, a non-light emitting side of Organic EL Element 1 was covered with a glass cover to form Lighting Device 1 having a composition shown in FIG. 1 and FIG. 2.

Figure 2:
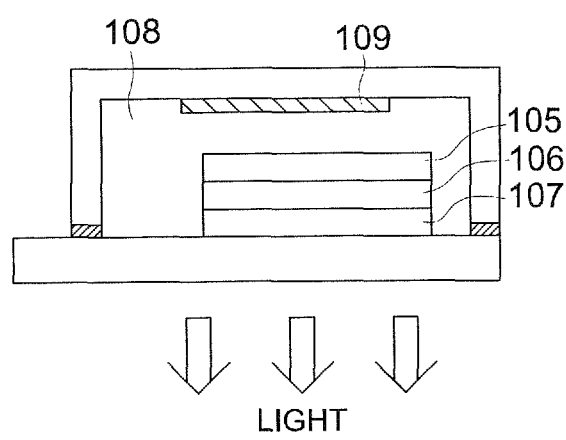
FIG. 2 is a schematic cross-sectional view to show an example of a lighting device containing a white organic EL element of the present invention.

FIG. 1 is a schematic view of a lighting device in which Organic EL Element 101 is covered with glass cover 102. Sealing, employing the glass cover, was conducted in a glove box under a nitrogen ambience (ambience of high purity nitrogen gas at a purity of at least 99.999%) without allowing it to come into contact with atmosphere. FIG. 2 is a cross-sectional view of a lighting device, in which 105 represents a cathode, 106 represents an organic EL layer, and 107 represents a glass substrate fitted with a transparent electrode. Glass cover 102 is filled with nitrogen gas 108 and desiccant 109 is provided.

Thus prepared lighting device was supplied with electricity resulting in emitting almost white light. It was confirmed that it can be used as a lighting device.

[Preparation of Organic EL Element 2]

After a positive hole transporting layer was prepared in the same manner as used for the preparation of Organic EL Element 1, light emitting layers were prepared in the following manner.

E-66 and Compound 1-6 were simultaneously deposited at a deposition rate of 0.1 nm/second so that the concentration of E-66 would result in 15% by weight. Then, the deposition amount of E-66 was gradually decreased so as to form a light emitting layer having a thickness of 15 nm in which a concentration of E-66 becomes 9% by weight. The formed blue phosphorescence emitting layer has a maximum emission wavelength of 471 nm and has a layer thickness of 15 nm. Here, the concentration of E-66 continuously changes in the light emitting layer from the anode side to the cathode side.

Then, Ir-1, Ir-14 and Compound 1-6 were simultaneously deposited at a deposition rate of 0.1 nm/second so that the concentrations of Ir-1 and Ir-14 each respectively would result in 14% by weight and 1.8% by weight, whereby a 9 nm thick green-red phosphorescence emitting layer having a maximum emission wavelength of 622 nm was formed.

Thereafter, M-1 was deposited to result in a thickness of 5 nm, whereby a positive hole blocking layer was formed. Further, CsF was deposited together with Compound M-1 to result in 10% by weight, whereby a 45 nm thick electron transporting layer was formed. Then, by depositing aluminum having a thickness of 110 nm to form a cathode, Organic EL Element 2 was thus prepared.

Subsequently, a non-light emitting side of Organic EL Element 2 was covered with a glass cover to form Lighting Device 2 having a composition shown in FIG. 1 and FIG. 2.

[Preparation of Organic EL Element 3]

After a positive hole transporting layer was prepared in the same manner as used for the preparation of Organic EL Element 1, light emitting layers were prepared in the following manner.

Ir-1, Ir-14 and Compound 1-6 were simultaneously deposited at a deposition rate of 0.1 nm/second so that the concentrations of Ir-1 and Ir-14 each respectively would result in 15% by weight and 2% by weight, whereby an 8 nm thick green-red phosphorescence emitting layer (Light Emitting Layer 1 listed in Table 1) having a maximum emission wavelength of 622 nm was formed.

Subsequently, E-66 and Compound 1-6 were simultaneously deposited at a deposition rate of 0.1 nm/second so that the concentration of E-66 would result in 15% by weight. Then, the deposition amount of E-66 was gradually decreased so as to form a light emitting layer having a thickness of 15 nm in which a concentration of E-66 becomes 9% by weight. The formed blue phosphorescence emitting layer (Light Emitting Layer 2 listed in Table 1) has a maximum emission wavelength of 471 nm and has a layer thickness of 15 nm. Here, the concentration of E-66 continuously changes in the light emitting layer from the anode side to the cathode side.

Thereafter, M-1 was deposited to result in a thickness of 5 nm, whereby a positive hole blocking layer was formed. Further, CsF was deposited together with M-1 to result in 10% by weight, whereby a 45 nm thick electron transporting layer was formed. Then, by depositing aluminum having a thickness of 110 nm to form a cathode, Organic EL Element 3 was thus prepared.

Subsequently, a non-light emitting side of Organic EL Element 3 was covered with a glass cover to form Lighting Device 3 having a composition shown in FIG. 1 and FIG. 2.

[Preparation of Organic EL Element 4]

Organic EL element 4 was prepared in the same manner as used for the preparation of Organic EL Element 3, except that the layer thickness, a host compound and a concentration of a dope in a green-red phosphorescence emitting layer (Light Emitting Layer 1 listed in Table 1); and a host compound in a blue phosphorescence emitting layer (Light Emitting Layer 2 listed in Table 1) were changed to those described in Table 1. Lighting Device 4 was prepared by using the formed Organic EL Element 4.

[Preparation of Organic EL Elements 5 and 6]

Organic EL Elements 5 and 6 were prepared in the same manner as used for the preparation of Organic EL Element 3, except that a concentration of a dope in a blue phosphorescence emitting layer (Light Emitting Layer 2 listed in Table 1) was changed to that described in Table 1. Lighting Devices 5 and 6 were prepared by using the formed Organic EL Elements 5 and 6. Here, the concentration of E-66 in Light Emitting Layer 2 of Organic EL Element 5 changes in a stepwise manner in the light emitting layer from the anode side to the cathode side.

The concentration of E-66 in Light Emitting Layer 2 of Organic EL Element 6 continuously changes at the side of anode in a thickness of 10 nm among the total layer thickness of 15 nm, but the concentration of E-66 is constant at the side of the cathode in a thickness of 5 nm.

[Preparation of Organic EL Element 7]

After a positive hole transporting layer was prepared in the same manner as used for the preparation of Organic EL Element 1, light emitting layers were prepared in the following manner.

Ir-1 and Compound 1-6 were simultaneously deposited at a deposition rate of 0.1 nm/second so that the concentrations of Ir-1 would result in 14% by weight, whereby a 5 nm thick green phosphorescence emitting layer (Light Emitting Layer 1 listed in Table 1) was formed.

Ir-14 and Compound 1-6 were simultaneously deposited at a deposition rate of 0.1 nm/second so that the concentrations of Ir-14 would result in 5% by weight, whereby a 4 nm thick red phosphorescence emitting layer (Light Emitting Layer 2 listed in Table 1) was formed. In addition, E-66 and Compound 1-6 were simultaneously deposited at a deposition rate of 0.1 nm/second so that the concentration of E-66 would result in 15% by weight. Then, the deposition amount of E-66 was gradually decreased so as to form a blue phosphorescence emitting layer having a thickness of 15 nm in which a concentration of E-66 becomes 9% by weight. The formed blue phosphorescence emitting layer has a maximum emission wavelength of 471 nm and has a layer thickness of 15 nm. Here, the concentration of E-66 continuously changes in the light emitting layer from the anode side to the cathode side.

TABLE 1

| Organic EL Element No. | Positive Hole Injection Layer (layer thickness nm) | *3 | Light Emitting Layer 1 Dopant (weight %) | ** | Light Emitting Layer 2 Dopant (weight %) | ** |
|---|---|---|---|---|---|---|
| 1 | m-MTDATA(10) | α-NPD(30) | Ir-1(15) Ir-14(2) | 1-6(8) | E-66(12) | 1-6(15) |
| 2 | m-MTDATA(10) | α-NPD(30) | E-66(15→9) | 1-6(15) | Ir-1(14) Ir-14(1.8) | 1-6(9) |
| 3 | m-MTDATA(10) | α-NPD(30) | Ir-1(15) Ir-14(2) | 1-6(8) | E-66(15→9) | 1-6(15) |
| 4 | m-MTDATA(10) | α-NED(30) | Ir-1(17) Ir-14(4.4) | 1-7(7) | E-66(15→9) | 1-7(15) |
| 5 | m-MTDATA(10) | α-NPD(30) | Ir-1(15) Ir-14(2) | 1-6(8) | *1 | 1-6(15) |
| 6 | m-MTDATA(10) | α-NPD(30) | Ir-1(15) Ir-14(2) | 1-6(8) | *2 | 1-6(15) |
| 7 | m-MTDATA(10) | α-NPD(30) | Ir-1(14) | 1-6(5) | Ir-14(5) | 1-6(4) |

| Organic EL Element No. | Light Emitting layer 3 Dopant (weight %) | ** | Positive Hole Inhibition Layer (layer thickness nm) | Electron Transport Layer Dopant (weight %) | ** | Remarks |
|---|---|---|---|---|---|---|
| 1 | — | — | M-1(5) | CsF(10) | M-1(45) | Comp. |
| 2 | — | — | M-1(5) | CsF(10) | M-1(45) | Comp. |
| 3 | — | — | M-1(5) | CsF(10) | M-1(45) | Inv. |
| 4 | — | — | M-1(5) | CsF(10) | M-1(45) | Inv. |
| 5 | — | — | M-1(5) | CsF(10) | M-1(45) | Inv. |
| 6 | — | — | M-1(5) | CsF(10) | M-1(45) | Inv. |
| 7 | E-66(15→9) | 1-6(15) | M-1(5) | CsF(10) | M-1(45) | Inv. |

** Host compound (layer thickness nm),
*1: E-66(15% 5 nm/12% 5 nm/9% 5 nm)
*2: E-66(15%→12%)10 nm/12% 5 nm,
*3: Positive Hole Transport Layer (layer thickness nm)
Comp.: Comparison,
Inv.: Present Invention Details of compounds each described in abbreviation in Table 1 are as follows.

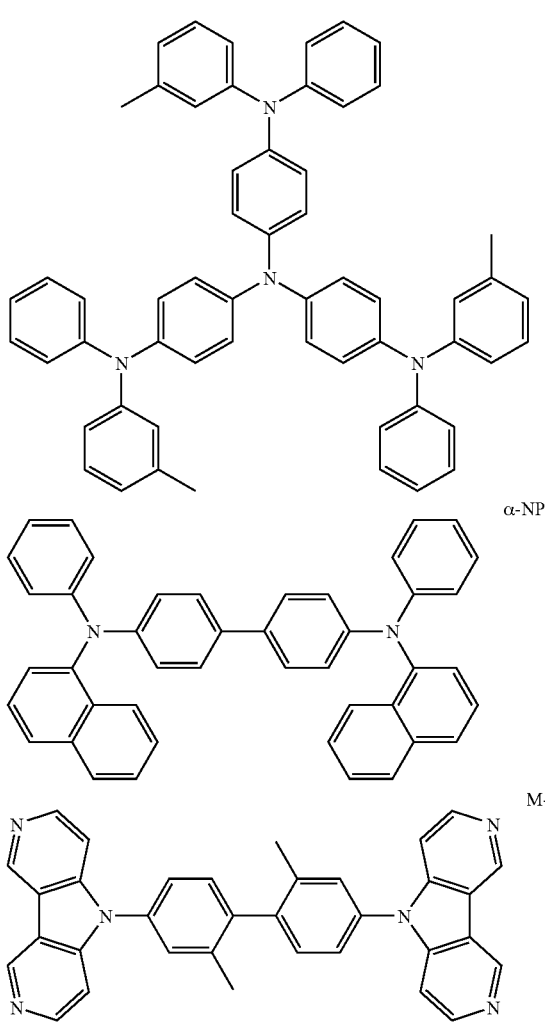

<<Evaluation of Organic EL Elements>>

[Determination of Electric Power]

The front luminance and luminance angle dependence of each organic EL element was determined employing a spectroradiometric luminance meter CS-1000 (produced by Konica Minolta Sensing Inc.), and the electric power efficiency at a front luminescence of 1,000 cd/m² was determined. In Table 2, relative values are listed when the electric power efficiency of Organic EL Element 3 is set to be 100.

[Determination of Driving Lifetime]

Luminance variation during continuous driving was determined employing a front luminance of 4,000 cd/m² as an initial luminance, and the half period of the luminance was obtained as the driving lifetime. In Table 2, relative values of the driving lifetime are listed when that of Organic EL Element 3 is set to be 100.

[Evaluation of Chromaticity Stability after Prolonged Driving Time]

The chromaticity at t=0, at 20% luminance decrease, and at a half luminance decrease each were determined employing a spectroradiometric luminance meter CS-1000 (produced by Konica Minolta Sensing Inc.). The chromaticity difference ΔE, was calculated using the formula below. In the formula, x and y are chromaticity values in CIE 1931 color space.

$$\Delta E = (\Delta x^2 + \Delta y^2)^{1/2}$$

TABLE 2

| Organic EL Element No. | Electric Power Efficiency % | Driving Lifetime % | ΔE at a Half Luminance | Remarks |
|---|---|---|---|---|
| 1 | 91 | 87 | 0.04 | Comparison |
| 2 | 56 | 73 | 0.15 | Comparison |
| 3 | 100 | 100 | 0.02 | Present Invention |
| 4 | 110 | 91 | 0.02 | Present Invention |
| 5 | 94 | 96 | 0.03 | Present Invention |
| 6 | 98 | 98 | 0.03 | Present Invention |
| 7 | 90 | 95 | 0.03 | Present Invention |

As clearly shown from the results described in Table 2, it was found that Organic EL Elements 3 to 7 are excellent in any of electric power efficiency and driving lifetime resulting in achieving a good balance compared to Comparative Organic EL Elements 1 and 2. In particular, it was found that Organic EL Elements 3 to 6, in which the layer composition of the light emitting layers is within a preferred range of the present invention, achieved preferred characteristics.

Example 2

Preparation of Organic EL Element

[Preparation of Organic EL Element 8]

Organic EL Element 8 was prepared in the same manner as used for the preparation of Organic EL Element 3, except that the layer thickness of the green-red phosphorescence emitting layer (Light Emitting Layer 1 in Example 1) and the host compound employed therein were changed to those described in Table 3. Then Lighting Device 8 was prepared using Organic EL Element 8 in the same manner as in Example 1.

TABLE 3

| Organic EL Element No. | Positive Hole Injection Layer (layer thickness nm) | Positive Hole Transport Layer (layer thickness nm) | Light Emitting Layer 1 Dopant (weight %) | *1 | Light Emitting Layer 2 Dopant (weight %) | *1 | Positive Hole Inhibition Layer (layer thickness nm) | Electron Transport Layer Dopant (weight *) | *1 | Remarks |
|---|---|---|---|---|---|---|---|---|---|---|
| 8 | m-MTDATA(10) | α-NPD(30) | Ir-1(15) Ir-14(2) | CBP(12) | E-66(15→9) | 1-6(15) | M-1(5) | CsF(10) | M-1(45) | Inv. |

*1: Host compound (layer thickness nm),
Inv.: Present Invention

The structure of the compound (CBP) listed in Table 3, but not listed in Table 1, is as follows.

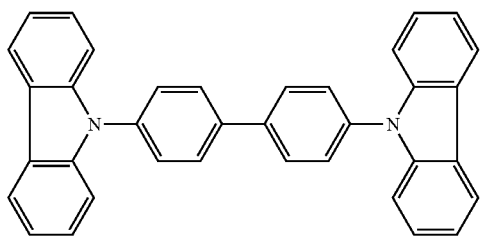

CBP

<<Evaluation of Organic EL Element>>

The electric power efficiency, the driving lifetime and the chromaticity stability after a prolonged driving time were evaluated in the same manner as the methods described in Example 1. In Table 4, the electric power efficiency and the driving lifetime are listed as the relative values when the corresponding values of Organic EL Element 3 are set to be 100.

TABLE 4

| Organic EL Element No. | Electric Power Efficiency % | Driving Lifetime % | ΔE at a Half Luminance | Remarks |
|---|---|---|---|---|
| 3 | 100 | 100 | 0.02 | Present Invention |
| 8 | 105 | 80 | 0.04 | Present Invention |

As clearly shown from the results described in Table 4, it was found that, by employing the host compound both in Light Emitting Layer 1 (the green-red phosphorescence emitting layer) and in Light Emitting Layer 2 (the blue phosphorescence emitting layer) which are adjacent each other, excellent characteristics can be achieved, especially excellent lifetime can be achieved.

Example 3

Preparation of Organic EL Elements 9 to 11

Organic EL Elements 9 to 11 were prepared in the same manner as the preparation of Organic EL Element 3 described in Example 1, except that the host compound employed in the blue phosphorescence emitting layer (Light Emitting Layer 2 in Table 1) and the layer thickness thereof were changed to those described in Table 5, thereafter, Lighting Devices 9 to 11 were prepared in the same manner as in Example 1.

<<Evaluation of Organic EL Element>>
[Evaluation of Storage Stability]

After keeping each of the prepared Organic EL Elements at a condition of 70° C. for 200 hours, the rate of change in luminance obtained by driving it with a constant electric current of 2.5 mA/cm² was measured. This value was used for evaluating the storage stability of Organic EL Elements.

The evaluation results of the storage stability of Organic EL Elements 3, and 9 to 11 are shown in Table 6. The glass transition temperatures of the host compound used in the blue phosphorescence emitting layer are also shown therein.

TABLE 6

| Organic EL Element No. | Evaluation Result | | Remarks |
|---|---|---|---|
| | Storage Stability % | Glass Transition Temperature ° C. | |
| 3 | 97 | 132 | Present Invention |
| 9 | 85 | 91 | Present Invention |
| 10 | 98 | 166 | Present Invention |
| 11 | 30 | 64 | Present Invention |

As is clearly shown from the results described in Table 6, the host compound used in the blue phosphorescence emitting layer strongly affects the storage stability. It can be seen that this property is related with a glass transition temperature of the host compound. In particular, it is clear that Organic EL Elements 3 and 10 which incorporated a host compound having a glass transition temperature of 130° C. or more showed excellent storage stability.

Example 4

Preparation of Organic EL Elements 12 and 13

Organic EL Elements 12 and 13 were prepared in the same manner as the preparation of Organic EL Element 3 described in Example 1, except that the compound employed in the blue phosphorescence emitting layer (Light Emitting Layer 2 in Table 1) were changed to those described in Table 7, thereafter, Lighting Devices 12 and 13 were prepared in the same manner as in Example 1.

TABLE 5

| Organic EL Element No. | Positive Hole Injection Layer (layer thickness nm) | Positive Hole Transport Layer (layer thickness nm) | Light Emitting Layer 1 | | Light Emitting Layer 2 | | Positive Hole Inhibition Layer (layer thickness nm) | Electron Transport Layer | | Remarks |
|---|---|---|---|---|---|---|---|---|---|---|
| | | | Dopant (weight %) | *1 | Dopant (weight %) | *1 | | Dopant (weight %) | *1 | |
| 9 | m-MTDATA(10) | α-NPD(30) | Ir-1(15) Ir-14(2) | 1-6(8) | E-66(15→9) | 1-10(14) | M-1(5) | CsF(10) | M-1(45) | Inv. |
| 10 | m-MTDATA(10) | α-NPD(30) | Ir-1(15) Ir-14(2) | 1-6(8) | E-66(15→9) | 1-7(14) | M-1(5) | CsF(10) | M-1(45) | Inv. |
| 11 | m-MTDATA(10) | α-NPD(30) | Ir-1(15) Ir-14(2) | 1-6(8) | E-66(15→9) | 1-31(12) | M-1(5) | CSF(10) | M-1(45) | Inv. |

*1: Host compound (layer thickness nm),
Inv.: Present Invention

TABLE 7

| Organic EL Element No. | Positive Hole Injection Layer (layer thickness nm) | Positive Hole Transport Layer (layer thickness nm) | Light Emitting Layer 1 Dopant (weight %) | *1 | Light Emitting Layer 2 Dopant (weight %) | *1 | Positive Hole Inhibition Layer (layer thickness nm) | Electron Transport Layer Dopant (weight %) | *1 | Remarks |
|---|---|---|---|---|---|---|---|---|---|---|
| 12 | m-MTDATA(10) | α-NPD(30) | Ir-1(15) Ir-14(2) | 1-6(8) | E-67(15→9) | 1-6(15) | M-1(5) | CsF(10) | M-1(45) | Inv. |
| 13 | m-MTDATA(10) | α-NPD(30) | Ir-1(15) Ir-14(2) | 1-6(8) | E-68(15→9) | 1-6(15) | M-1(5) | CsF(10) | M-1(45) | Inv. |

*1: Host compound (layer thickness nm),
Inv.: Present Invention

<<Evaluation of Organic EL Elements>>
[Determination of Color Rendering Property]

The emission spectrum of each organic EL element at a front luminescence of 1,000 cd/m² was determined employing a spectroradiometric luminance meter CS-1000 (produced by Konica Minolta Sensing Inc.). By employing the obtained data, an average color rendering evaluation value (Ra) was calculated using the method based on JIS Z 8726-1990. In Table 8, the calculated results are shown after ranked in accordance with the criteria shown below. The maximum emission wavelength of the blue phosphorescence emitting layer (Light Emitting Layer 2 in Table 7) is also shown in Table 8.

A: Ra≥80 (Excellent color rendering property)
B: Ra≥70 (Practically good color rendering property)
C: Ra≥60 (Slightly inferior color rendering property)
D: Ra<60 (Bad color rendering property and cannot be used for practical use)

TABLE 8

| | Evaluation Result | | |
|---|---|---|---|
| Organic EL Element No. | Color rendering property | Maximum emission wavelength of Light Emitting Layer 2 [nm] | Remaeks |
| 3 | B | 471 | Present Invention |
| 12 | A | 465 | Present Invention |
| 13 | A | 455 | Present Invention |

As is clearly shown from the results described in Table 8, the maximum emission wavelength of the blue phosphorescence emitting layer strongly affects the color rendering property. In particular, it is clear that an excellent color rendering property was shown when the maximum emission wavelength of the blue phosphorescence emitting layer was 465 nm or less.

What is claimed is:

1. A white organic electroluminescent element comprising:
light emitting layers between an anode and a cathode,
wherein the light emitting layers include:
a light emitting layer A which contains a host compound and a phosphorescence emitting dopant exhibiting a maximum emission wavelength of 480 nm or less; and
a light emitting layer B which contains a phosphorescence emitting dopant exhibiting a maximum emission wavelength of 510 nm or more,
provided that the light emitting layer B is located between the light emitting layer A and the anode; and
a concentration of the phosphorescence emitting dopant in the light emitting layer A changes in a thickness direction of the light emitting layer A,
wherein the concentration of the phosphorescence emitting dopant contained in the light emitting layer A is decreased from a side of the anode to a side of the cathode in a thickness direction of the light emitting layer A;
wherein the phosphorescence emitting dopant contained in the light emitting layer A has at least one of partial structures represented by Formulas (A) or (B):

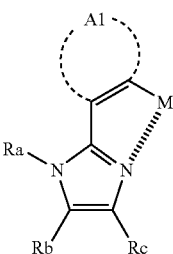

Formula (A)

wherein
Ra represents a hydrogen atom, an aliphatic group, an aromatic group or a heterocyclic group;
Rb and Rc each represent a hydrogen atom or a substituent;
A1 represents a group of atoms necessary to form an aromatic ring or an aromatic heterocyclic ring; and
M represents Ir or Pt,

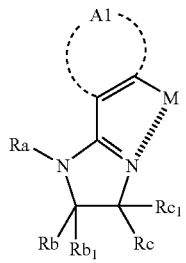

Formula (B)

wherein
Ra represents a hydrogen atom, an aliphatic group, an aromatic group or a heterocyclic group;
Rb, Rc, $Rb_1$ and $Rc_1$ each represent a hydrogen atom or a substituent;
A1 represents a group of atoms necessary to form an aromatic ring or an aromatic heterocyclic ring; and
M represents Ir or Pt; and the host compound contained in the light emitting layer A is represented by Formula (a):

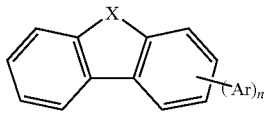

Formula (a)

wherein
X represents O;
Ar represents an aromatic ring; and
n is an integer of 0 to 8.

2. The white organic electroluminescent element described in claim 1,
wherein the phosphorescence emitting dopant contained in the light emitting layer A exhibits a maximum emission wavelength of 465 nm or less.

3. The white organic electroluminescent element described in claim 1,
wherein the light emitting layer B contains at least two phosphorescence emitting dopants each exhibiting an maximum emission wavelength differing in an amount of 30 nm or more with each other.

4. The white organic electroluminescent element described in claim 1,
wherein the light emitting layer A and the light emitting layer B each contain the host compound represented by the Formula (a), and the host compound has a glass transition temperature of 90° C. or more.

5. A lighting device comprising the white organic electroluminescent element described in claim 1.

6. The white organic electroluminescent element described in claim 1,
wherein the phosphorescence emitting dopant contained in the light emitting layer A has an ionization energy of higher than 5.1 eV.

* * * * *